US006961229B2

United States Patent
Otsuka et al.

(10) Patent No.: US 6,961,229 B2
(45) Date of Patent: Nov. 1, 2005

(54) ELECTRONIC CIRCUIT DEVICE

(75) Inventors: Kanji Otsuka, Kohan 2-1074-38, Higashiyamato-shi, Tokyo (JP); Tamotsu Usami, Nishi-machi 2-38-4, Kokubunji-shi, Tokyo (JP)

(73) Assignees: Kanji Otsuka, Higashiyamato (JP); Tamotsu Usami, Kokubunji (JP); Sanyo Electric Co., Ltd., Moriguchi (JP); Oki Electric Industry Co., Ltd., Tokyo (JP); Sharp Kabushiki Kaisha, Osaka (JP); Sony Corporation, Tokyo (JP); Kabushiki Kaisha Toshiba, Tokyo (JP); NEC Corporation, Tokyo (JP); Hitachi, Ltd., Tokyo (JP); Matsushita Electric Industrial Co., Ltd., Kadoma (JP); Mitsubishi Denki Kabushiki Kaisha, Tokyo (JP); Fujitsu Limited, Kawasaki (JP); Rohm Co., Ltd., Kyoto (JP)

( * ) Notice: Subject to any disclaimer, the term of this patent is extended or adjusted under 35 U.S.C. 154(b) by 30 days.

(21) Appl. No.: 10/781,942

(22) Filed: Feb. 20, 2004

(65) Prior Publication Data

US 2004/0207432 A1 Oct. 21, 2004

(30) Foreign Application Priority Data

Feb. 24, 2003 (JP) ............................ 2003-045422

(51) Int. Cl.$^7$ .................. H01G 4/00; H03H 7/38
(52) U.S. Cl. ............. 361/301.2; 361/321; 361/386; 361/729; 326/86; 326/30; 326/21; 257/680; 257/659; 333/33; 333/247
(58) Field of Search .............. 326/21, 30, 86, 326/90; 333/33, 247; 361/301.2, 320, 321, 321.4, 728, 729, 386, 794; 257/778, 680, 659

(56) References Cited

U.S. PATENT DOCUMENTS 6,373,275 B1 * 4/2002 Otsuka et al. ............. 326/30
6,625,005 B2 * 9/2003 Otsuka et al. ............. 361/301.2
6,670,830 B2 * 12/2003 Otsuka et al. ............. 326/86

* cited by examiner

Primary Examiner—Vibol Tan
(74) Attorney, Agent, or Firm—Morrison & Foerster LLP

(57) ABSTRACT

An electronic circuit device having a power-supply structure capable of supporting fast signals in and above a GHz band is offered. A driver transistor is formed in a surface of a semiconductor substrate. Power-supply/ground pair transmission lines which provide the driver transistor with power and signal/ground pair transmission lines which transmit signals to a receiver are formed on the semiconductor substrate. The power-supply/ground pair transmission lines are connected to a drain layer of the driver transistor and a P$^+$ layer in a P well. The signal/ground pair transmission lines are connected to a source layer of the driver transistor and a P$^+$ layer in the P well.

16 Claims, 22 Drawing Sheets electromagnetic field pair coplanar lines guarded coplanar lines
(outer lines connected together)

stacked pair lines guarded stacked pair lines

| Type | = Surface |
| Monitor | = h-field |
| Component | = Abs |
| Sample | = 84 / 101 |
| Time | = 8.3e-010 | simulation of progress of electromagnetic wave around confluence of power-supply/ground pair transmission lines Type = Surface Current
Monitor = h-field (t=0..1e
Component = Abs
Sample = 67 / 101
Time = 6.6e-010 simulation of progress electromagnetic
when two of three driver transistors turn on ahead

| | | | | Type | = Surface Current |
| - | - | - | - | - | - |
| 0[ns] | 0.05[ns] | 0.10[ns] | 0.15[ns] | Monitor | = h-field ( |
| | | | | Component | = Abs |
| | | | | Sample | = 86 / 101 |
| | | | | Time | = 8.5e-010 | simulation of progress of electromagnetic wave
around confluence of power-supply/ground
pair transmission lines simulation of progress of electromagnetic wave around confluence of power-supply/ground pair transmission lines P(pitch)=several μm
P×2 approximately

ELECTRONIC CIRCUIT DEVICE

BACKGROUND OF THE INVENTION

1. Field of the Invention

This invention relates to an electronic circuit device, specifically to an electronic circuit device having a structure to provide a power-supply capable of supporting fast signals in and above GHz band.

2. Description of the Related Art

A transistor which processes digital signals (and analog signals) in and above the GHz band makes fast switching with less than 100 ps of rise time and fall time. Electric energy corresponding to such fast switching has to be provided from the power-supply.

Issues of the power-supply are plainly explained through a metaphor of municipal water supply system. Even when a valve at a facet is opened very quickly, water does not come out of the faucet immediately. For example, transfer velocity of water power is 1500 m/s, thus it takes 6.7 $\mu$s for the water to run from the valve to the faucet when length between them is 10 mm. Even if the valve is fully opened in less than 6.7 $\mu$s, water only comes out from the faucet 6.7 $\mu$s later. In addition to that, it takes some time to accelerate the water to the velocity of 1500 m/s due to inertia of still water, the water does not reach such a high velocity because of friction resistance from a wall of the pipe due to viscosity of water. Water pressure in a main pipe connected with branch pipes to individual residential units is reduced to due to water discharged from the faucet since it is not possible to respond the rapid change when there is the inertia.

However, if the main pipe is 100 time larger than the branch pipe, the reduction in the water pressure is only ¹⁄₁₀₀ and practically negligible. Similar approach has been taken in conventional power-supply system. That is, a plane ground and a plane power-supply facing each other are provided. When they are not available, a bypass capacitor is used instead.

Transfer velocity of electric current due to charge transfer is equal to the velocity of an electromagnetic wave in a certain structure. When dielectric constant of the structure is 4, the transfer velocity is 1.5×10⁸ m/s. When the electric current begins to flow in the structure, a voltage drop $V_{drop}$ expressed by the following equation is caused by a parasitic inductance $L_s$ in a circuit.

$$V_{drop} = L_s di/dt$$

A notion of the friction resistance from the wall of the water pipe is somewhat different in the world of electricity. In rapidly changing electric current, the corresponding notion to it is a characteristic impedance of a wiring. A direct current resistance related to a cross-section of the wiring is less than a hundredth of the characteristic impedance and gives no problem in general. However, the direct current resistance due to the skin effect caused by the rapid change has to be taken into calculation in the GHz band.

As appreciated from the foregoing, the power-supply to a fast switch should have no inertia, i.e. no parasitic inductance $L_s$ and should have current capacity large enough to provide the switch with enough current when the switch is turned on. An electric current $I_{max}$ corresponding to conductance G of the switch is expressed by:

$$I_{max} = G V_{dd}$$

where $V_{dd}$ is a power supply voltage. It is independent from load conditions since it is the maximum allowable electric current. A voltage at an end of a receiver is determined by the electric current and the load. Generally speaking, although the notion that a power-supply has to be supported according to the magnitude of the load is useful in slow switching, it should be designed based on the maximum electric current $I_{max}$ in fast switching.

So, what would be a power-supply structure which can realize $L_s=0$ and $I_{max}=G V_{dd}$? The bypass capacitor always has the parasitic inductance $L_s$. The parasitic inductance $L_s$ is approximately 200 pH with a 1005 type capacitor. Another parasitic inductance of approximately 200 pH from an electrode portion to connect the bypass capacitor is added to it. That is, the parasitic inductance is 400 pH in total. With a 0603 type capacitor on the other hand, corresponding parasitic inductances are 120 pH and 150 pH, respectively, resulting in a total parasitic inductance of 270 pH. It would be very difficult to reduce the total parasitic inductance including the inductance from the electrode portion to less than 100 pH, even if a smaller capacitance would be developed in future.

Next, the electric current I of the bypass capacitor system is 5 mA, when a conductance G of a bus driver is 0.02 S (Siemens) and $V_{dd}$ is 1 V. Assuming that a pulse frequency is 10 GHz, a slew rate is about 30 ps. The voltage drop with the 0603 type capacitor is calculated by:

$$V_{drop} = 270 \text{ pH} \times 5 \text{ mA}/30 \text{ ps} = 45 \text{ mV}$$

Even when the minimum parasitic capacitance of 100 pH is assumed:

$$V_{drop} = 100 \text{ pH} \times 5 \text{ mA}/30 \text{ ps} = 17 \text{ mV}$$

When eight drivers are connected to the power-supply, the voltage drop for each case is 0.36 V and 0.136 V respectively, presenting a serious problem. Improving the power-supply with the bypass capacitor is very difficult as described above. Japanese Patent Application Publication No. 2001-210959 describes the issues described above.

SUMMARY OF THE INVENTION

The invention provides an electronic circuit device that includes a first pair transmission line comprising a power-supply line, a first ground line and a first insulating layer disposed between the power-supply line and the first ground line. A face of the power-supply line faces a face of the first ground line. The device also includes a driver transistor, and a second pair transmission line including a signal line, a second ground line and a second insulating layer disposed between the signal line and the second ground line. A face of the signal line faces a face of the second ground line, and an output of the driver transistor is supplied to the signal line. The power-supply line is directly connected to a drain layer of the driver transistor and the first ground line is connected to a substrate of the driver transistor.

The invention also provides an electronic circuit device that includes a main pair transmission line comprising a main power-supply line and a main ground line, and a plurality of branch pair transmission lines branching off from the main pair transmission line. Each of the branch pair lines includes a branch power-supply line and a branch ground line. The device also includes a driver transistor connected to each of the branch pair transmission lines, and another pair transmission line including a signal line and another ground line. An output of the driver transistor is supplied to the signal line. The device further includes a receiver circuit receiving a signal transmitted from the another pair transmission line.

BRIEF DESCRIPTION OF THE DRAWINGS

FIGS. 21A and 211B show power-supply/ground pair transmission lines having a directional coupler in an embodiment of this invention.

DETAILED DESCRIPTION OF THE INVENTION

Figure 1:
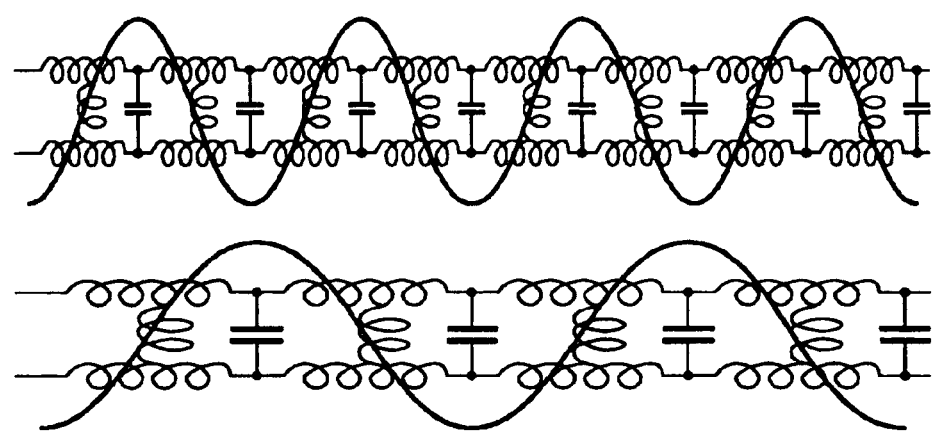
FIG. 1 shows LC ladder circuits equivalent to transmission lines of the embodiments this invention.

Next, embodiments of this invention will be described in detail, referring to the drawings. First, power-supply/ground pair transmission lines having a power-supply line and a ground line in a form of pair transmission lines will be explained, since they are used in an electronic circuit device of this invention.

A characteristic impedance $Z_0$ can be defined assuming that power-supply and ground lines are pair transmission lines. A case in which eight drivers are connected to the power-supply/ground pair transmission lines is considered, as an example. The condition to secure the maximum current $I_{max}$=5 mA×8=40 mA assuming the power-supply voltage $V_{dd}$=0.5 V is the characteristic impedance $Z_0$=12.5 Ω, since $I_{max}$=40 mA=$V_{dd}/Z_0$=0.5 V/12.5Ω. A parasitic inductance $L_s$ is zero, if the power-supply line and the ground line consist of the pair transmission lines only. The value is well enough within a designable range. The power-supply/ground pair transmission lines provide a power-supply capable of supporting fast operation. The structures of the embodiments of this invention are based on the power-supply/ground pair transmission lines.

The reasons why such power-supply/ground pair transmission lines can support the fast signals will be explained. An LC ladder circuit makes an equivalent circuit to lines of the characteristic impedance. Although it is an LC circuit, it does not have an LC resonance point, because the LC ladder circuit can be set to have arbitrary unit length which is a section of the LC ladder circuit. The LC ladder circuit is automatically divided into sections according to a frequency. Two examples are shown in FIG. 1.

Sine waves of voltage and current consistent with each other are considered. Capacitance components are considered to be mainly at the maximum and the minimum of the sine wave, where electric charge is accumulated most. Inductance components are considered to function at locations where gradient of the current is maximum, leading to expressions shown in FIG. 1. Since the same transmission line structure is repeated unlimitedly in such LC ladder circuit, the section can be varied automatically according to the frequency.

That is, impedance per unit length Z/1 is expressed by a following equation, given that a capacitance per unit length is C/1 and an inductance per unit length is L/1.

$$\frac{Z}{l} = \sqrt{Z_L Z_C} = \sqrt{\frac{j\omega L/l}{j\omega C/l}} = \sqrt{\frac{L}{C}} = Z_0 [\Omega]$$

where ω denotes an angular frequency, j denotes an imaginary number, and $Z_L=j\omega L/1$, $Z_C=1/j\omega C/1$. As $Z_L$ and $Z_C$ exist simultaneously in longitudinal direction, their geometric mean is taken. All of j, ω and 1 are cancelled out. $Z_0$ is an impedance in real number which does not have frequency characteristics or dimension of length. The impedance, a physical quantity independent of the length of the transmission lines, represents a frontage size of a pipe.

Depth behind the frontage is made of a pipe without friction resistance from a wall of the pipe. When a pulse of water flows through the pipe, it is transmitted intact even if distance is infinite. A conductance looked from an entrance of the transmission lines is $1/Z_0$. It is conceived that once a current corresponding to the conductance flows it can be carried infinite distance since there is no resistance.

When a model of physics of the transmission described above is considered, the energy of electric charge stored in the L and C travels through the transmission lines at a velocity of electromagnetic wave moving through freely divided LC sections, while only the characteristic impedance, which is the geometric mean of the L and C, is observed. It is important to note that a lumped model of LC often used in ordinary SPICE does not conform to this model. While the L and C do not appear in the transmission lines, all it takes is looking at $Z_0$.

When the power-supply/ground pair transmission lines are directly connected to power-supply/ground electrodes of the driver transistor, current I (under the condition described before, I=40 mA=$V_{dd}/Z_0$=0.5 V/12.5 Ω, $Z_0$=12.5 Ω) is immediately provided at the velocity of electromagnetic wave. There is no parasitic inductance Ls which makes the inertial force and causes a problem when the capacitor is used as described before.

The velocity of electromagnetic wave is $1.5\times10^8$ m/s when the dielectric constant is 4. The rate to form a channel of the driver depends on mobility of electric charge. It is $5\times10^5$ m/s under saturated electric field intensity in silicon and is about 1/1000 of the velocity of electromagnetic wave. The power-supply can be provided faster than the switching speed when the transmission line is connected to either a source structure or a drain structure having a length equal to or shorter than 1/100 of a gate length.

Figure 2:
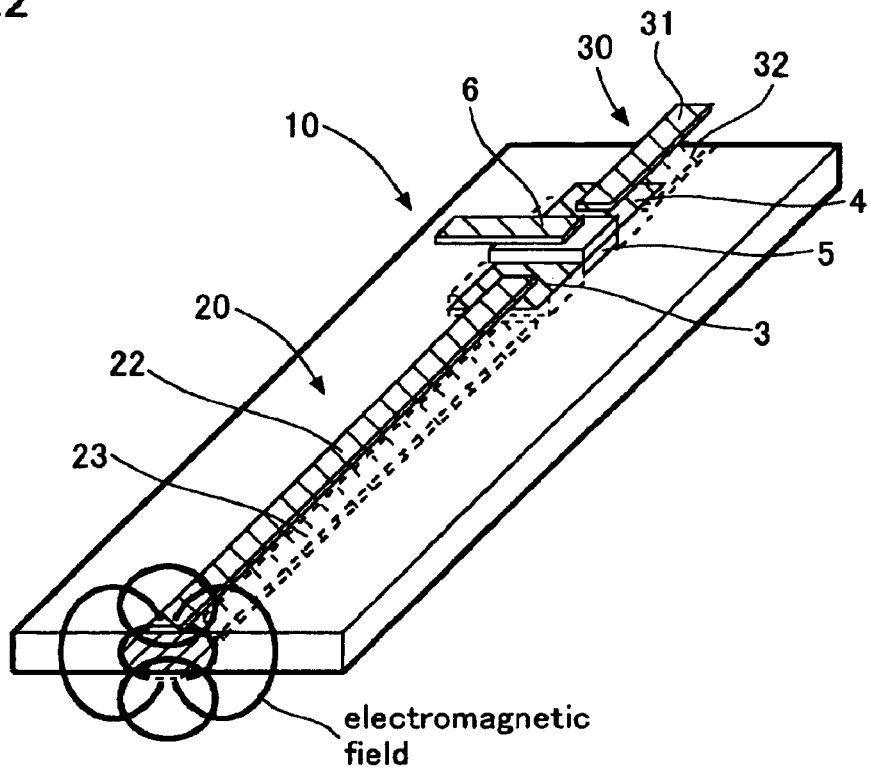
FIG. 2 is an oblique perspective figure showing a device structure of an embodiment of this invention in which power-supply/ground pair transmission lines are connected to a driver transistor.
Figure 3:
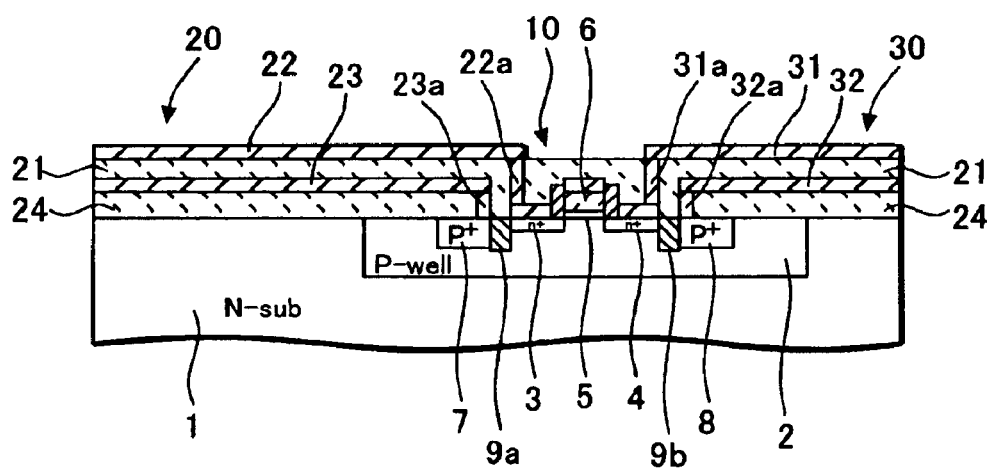
FIG. 3 is a cross-sectional view of the structure shown in FIG. 2.

Next, a detailed structure of an electronic circuit device using the power-supply/ground pair transmission lines will be described. FIG. 2 is an oblique perspective figure showing an ideal structure in which the power-supply/ground pair transmission lines are connected to a driver transistor. And FIG. 3 shows a cross-sectional structure cut along the portion where the power-supply/ground pair transmission lines are connected to the driver transistor. Such a power-supply structure minimizes a parasitic inductance $L_s$ formed by an electrode of the driver transistor.

First, a structure of the driver transistor 10 composed of an N channel type MOS transistor will be described. For example, an $N^+$ type drain layer 3 and an $N^+$ type source layer 4 are formed with a predetermined spacing in a P well 2 formed in a surface of a semiconductor substrate 1 such as a silicon substrate. The surface of the P well 2 between the drain layer 3 and the source layer 4 makes a channel region.

A gate electrode 6 is formed on a gate insulation film 5 formed on the channel region. The gate electrode 6 is formed of a poly silicon gate or a polycide gate which is made of stacked layers of poly silicon and refractory metal polycide such as tungsten silicide.

A $P^+$ layer 7 doped with higher concentration of impurities than the P well 2 is formed in the surface of the P well 2 away from the drain layer 3. Similarly, a $P^+$ layer 8 doped with higher concentration of impurities than the P well 2 is formed in the surface of the P well 2 away from the source layer 4. An insulating layer 9a is formed between the drain layer 3 and the P+ layer 7, while an insulating layer 9b is formed between the source layer 4 and the $P^+$ layer 8. The insulating layers 9a and 9b are formed by LOCOS (Local Oxidation of Silicon), for example.

The power-supply/ground pair transmission lines 20 are formed with a power-supply line 22 and a ground line 23 each made of a layer of metal such as aluminum and disposed parallel to each other with an insulating layer 21 in-between. An insulating layer 24 is formed between the ground line 23 and the semiconductor substrate 1.

A signal/ground pair transmission lines 30 are formed with a signal line 31 and a ground line 32 each made of a layer of metal such as aluminum and disposed parallel to each other with an insulating layer 21 in-between. An insulating layer 24 is formed between the ground line 32 and the semiconductor substrate 1.

The power-supply/ground pair transmission lines 20 and the signal/ground pair transmission lines 30 also form transmission line structures in vertical structures of connection columns and are connected to electrodes of the driver transistor 10. That is, as for the power-supply/ground pair transmission lines 20, a connection column 22a of the power-supply line 22 and a connection column 23a of the ground line 23 form vertical pair transmission lines. The connection column 22a is connected to the drain layer 3 which is a power-supply electrode of the driver transistor 10, while the connection column 23a is connected to the P+ layer 7 which is a ground electrode of the driver transistor 10. The connection column 22a is formed of a metal or the like buried in a via hole provided in the insulating layers 21 and 24, while the connection column 23a is formed of a metal or the like buried in a via hole provided in the insulating layer 24.

As for the signal/ground pair transmission lines 30, a connection column 31a of the signal line 31 and a connection column 32a of the ground line 32 form vertical pair transmission lines. The connection column 31a is connected to the source layer 4 which is an output electrode of the driver transistor 10, while the connection column 32a is connected to the $P^+$ layer 8 which is the ground electrode of the driver transistor 10. The connection column 31a is formed of a metal or the like buried in a via hole provided in the insulating layers 21 and 24, while the connection column 32a is formed of a metal or the like buried in a via hole provided in the insulating layer 24.

The parasitic inductance of zero ($L_s$=0) can be realized according to the structure described above. It is desirable that the distance between the power-supply/ground pair transmission lines 20 and the gate electrode 6 is kept larger than the distance between the power-supply line 22 and the ground line 23 in the power-supply/ground pair transmission lines 20, so that drain electric field and source electric field around the connection columns would not affect the gate electrode. Similarly, it is desirable that the distance between the signal/ground pair transmission lines 30 and the gate electrode 6 is kept larger than the distance between the signal line 31 and the ground line 32 in the signal/ground pair transmission lines 30. With this, by making diffusion depth of the drain layer 3 and the source layer 4 shallow, proximity effect can be prevented as much as possible.

Figure 4:
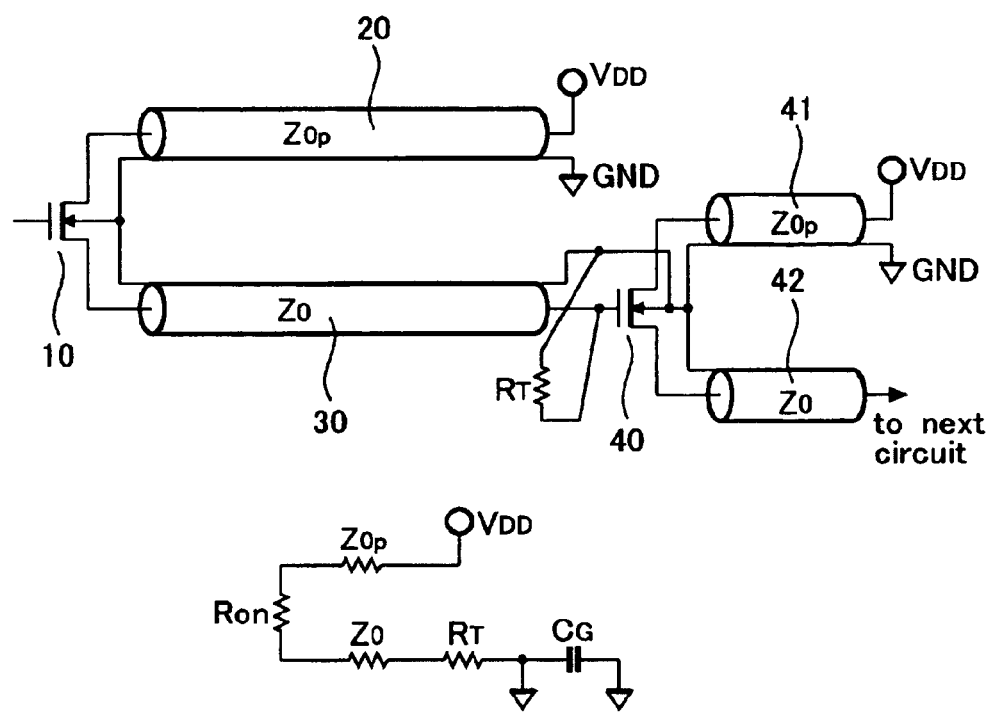
FIG. 4 shows circuit diagrams of a driver-receiver circuit of an embodiment of this invention.

FIG. 4 shows circuit diagrams of a driver-receiver circuit using the power-supply structured as described above. When the driver transistor 10 is turned on, the charge stored in the power-supply/ground pair transmission lines 20 is drawn to the signal/ground pair transmission lines 30. The charge is provided to the signal/ground pair transmission lines 30 and then led to a driver transistor 40 in a following stage with zero inertia, i.e. at the velocity of electromagnetic wave. Power-supply/ground pair transmission lines 41 and signal/ground pair transmission lines 42 of similar structure are connected to the receiver transistor 40. This is an example including one power-supply and one driver. When the characteristic impedance $Z_0$ of the signal/ground pair transmission lines 30 is 100 Ω, 100 Ω or more is enough for a characteristic impedance $Z_{0p}$ of the power-supply/ground pair transmission lines 20, as deduced from the water pipe analogy. A maximum current $I_{max}=V_{dd}/100$ Ω is obtained.

However, from a standpoint of a lumped model, if ON-resistance $R_{on}$ of the driver transistor 10 is 500 Ω, a signal voltage V becomes $V=V_{dd} R_T/(R_{on}+R_T)=0.17 V_{dd}$, thus 0.17 V at $V_{dd}=1$ V. It would be acceptable as a signal level of the driver transistor 10 which makes switching operation at 10 GHz. Similar level of amplitude is obtained at $V_{dd}=0.5$ V when $R_{on}=250$ Ω. $R_T$ denotes a value of a terminating resistance and $V_{dd}$ denotes a power-supply voltage.

Figure 5A:
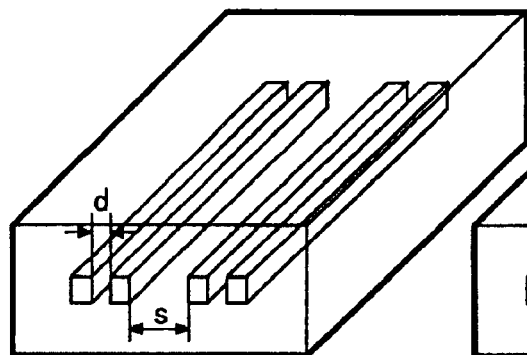
FIGS. 5A–5D show various types of structures of the transmission lines.
Figure 5B:
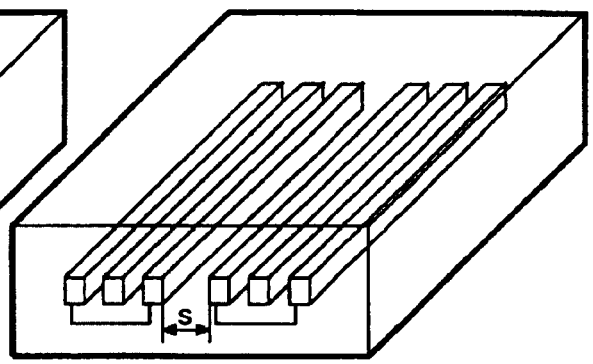
Figure 5C:
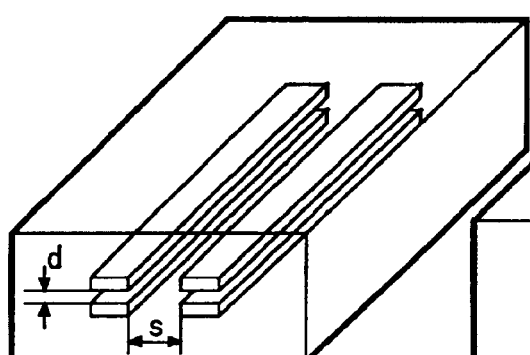
Figure 5D:
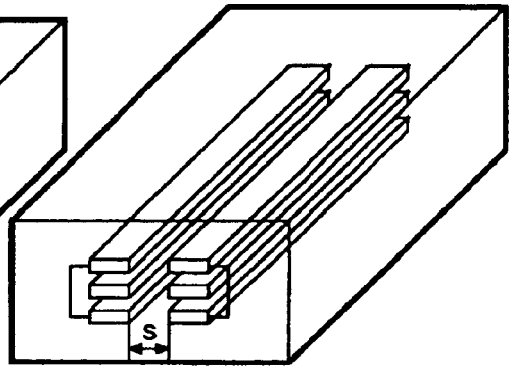

When eight drivers are connected to power-supply/ground pair transmission lines, fundamental problems are solved by making $Z_{0p}=100$ Ω/8=12.5 Ω. Various structures of transmission lines are shown in FIGS. 5A–5D. FIG. 5A shows pair coplanar lines in which pair lines are disposed on a common plane. FIG. 5B shows guarded common planar lines in which three lines are disposed on a common plane with both outer lines are connected together. FIG. 5C shows stacked pair lines in which pair lines are vertically stacked in parallel. FIG. 5D shows guarded stacked pair lines in which three lines are vertically stacked in parallel with both outer lines connected together. It is important in every structure that the lines are buried in a homogeneous insulating layer. Such structures show an incredible feature at first glance that the pair lines have almost no influence on adjacent pair lines even with s=d/2, where s represents a distance between the transmission lines and d represents a distance between the lines of the transmission lines.

This is because electromagnetic wave propagating through the adjacent pair lines does not take a form of traveling-wave as opposed to traveling-wave electromagnetic wave in the pair lines. Keeping s>d/2 is enough. The transmission lines is an advantageous structure to convey energy.

Figure 6:
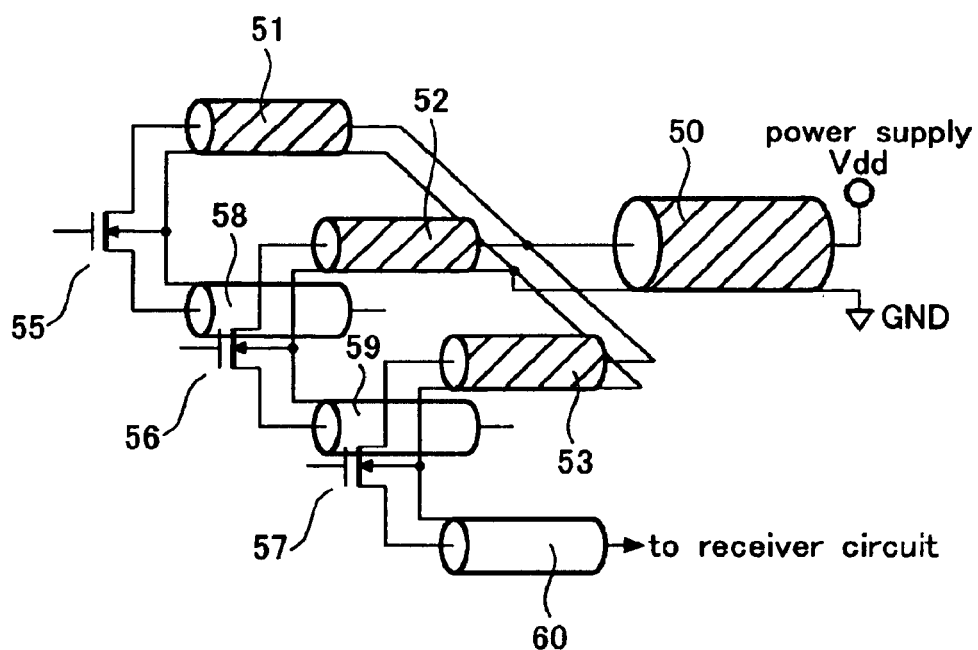
FIG. 6 is an equivalent circuit diagram showing a structure of a power-supply to three drivers in an embodiment of this invention.
Figure 7:
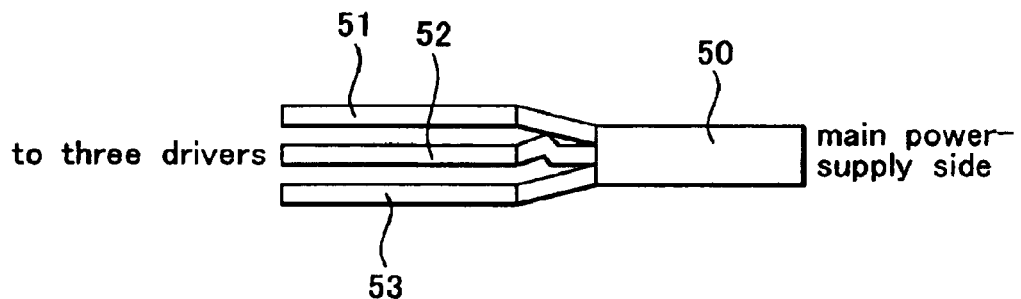
FIG. 7 shows an example of power-supply/ground pair transmission lines for the three drivers made of stacked pair lines.

Next, a structure of a power-supply to a plurality of drivers will be explained. A power-supply to three drivers is considered for simplicity. FIG. 6 is an equivalent circuit diagram showing a structure of the power-supply to three drivers. FIG. 7 shows an example of power-supply/ground pair transmission lines for three drivers made of the stacked pair lines.

Branch power-supply/ground pair transmission lines 51, 52 and 53 are branched off from main power-supply/ground pair transmission lines 50. Each of driver transistors 55, 56 and 57 is connected to each of the branch power-supply/ground pair transmission lines 51, 52 and 53, respectively. Each of signal/ground pair transmission lines 58, 59 and 60 is connected to each of the driver transistors 55, 56 and 57, respectively.

As seen from FIGS. 6 and 7, when the three drivers turn on simultaneously and draw out charge from the power-supply, there is no problem since characteristic impedances of the three branch power-supply/ground pair transmission lines 51, 52 and 53 at confluence are matching. It is assumed that characteristic impedance $Z_{0ps}$ of the main power-supply/ground pair transmission lines is 16.6 Ω and characteristic impedance $Z_{0pt}$ of each of the branch power-supply/ground pair transmission lines 51, 52 and 53 is 50 Ω.

When matching condition of the characteristic impedance is generalized:

$$Z_{0ps}=Z_{0pt}/n$$

where n represents a number of branch power-supply/ground pair transmission lines. It is assumed that every branch power-supply/ground pair transmission lines have equal characteristic impedance $Z_{0pt}$. In the example of three drivers, n=3. A reflection factor Γ of electromagnetic energy of the branch power-supply/ground pair transmission lines 51, 52 and 53 at the confluence with the main power-supply/ground pair transmission lines 50 is defined by following equation:

$$\Gamma=(Z_{0pt}/n-Z_{0ps})/(Z_{0pt}/n+Z_{0ps})=0$$

And this value is zero (Γ=0).

The energy reflection factor Γ equal to or less than 10% is acceptable in designing the power-supply. Considering the above, satisfying following conditions is enough to obtain this condition.

$$Z_{ops} \leq Z_{opt}/n \leq 1.2 Z_{ops}$$

That is, when 1.2 $Z_{0ps}=Z_{0pt}$, $$\Gamma=(1.2 Z_{0ps}-Z_{0ps})/(1.2 Z_{0ps}+Z_{0ps})=0.2/2.2=0.091$$

Thus the energy reflection factor F becomes less than 10%.

Figure 8A:
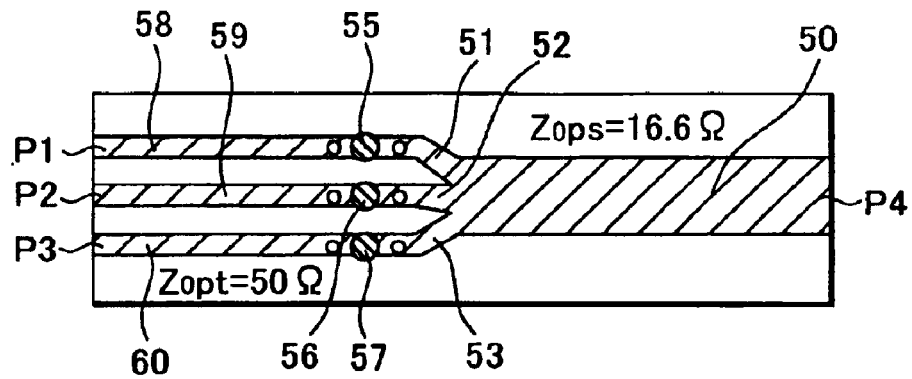
FIGS. 8A and 8B show results of simulation of propagation of electromagnetic waves at junctions of the power-supply/ground pair transmission lines in an embodiment of this invention.
Figure 8B:
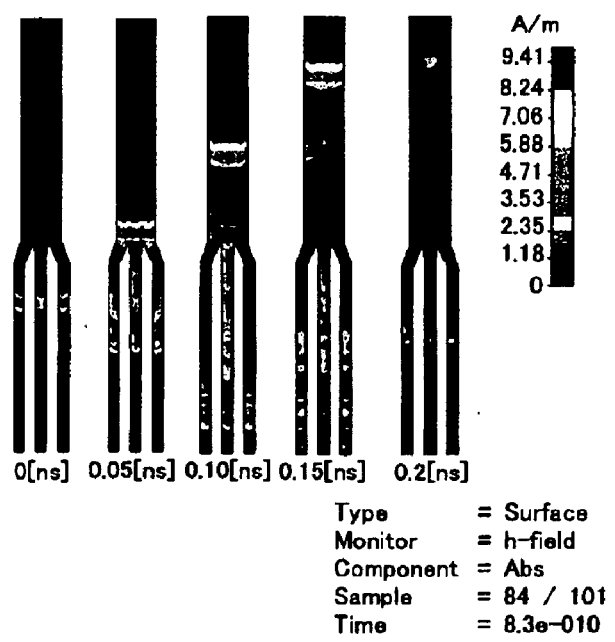

A simulation model and simulated electromagnetic waves are shown in FIGS. 8A and 8B. FIG. 8A shows the simulation model and FIG. 8B shows distribution of surface magnetic field according to the simulation model. It is considered that the location of large change in the magnetic field is the location of large change in electric current.

The signal line side gets large reflection at the moment the electromagnetic wave reaches each of ports P1, P2 and P3 because ON-resistance $R_{on}$ of each of the driver transistors 55, 56 and 57 is 200 Ω. Thus the electromagnetic wave appears as if it propagates to both sides immediately after the transistors are turned on. The ports P1, P2 and P3 are points of measurement in the simulation and are arbitrarily chosen for the simulation calculations. It was revealed that the electromagnetic wave travels straight forward also after the traveling wave merges into the main power-supply/ground pair transmission lines 50.

Figure 9:
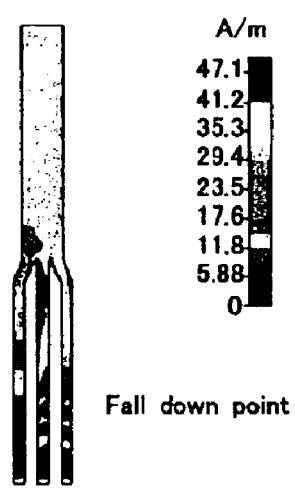
FIG. 9 shows a result of simulation for an embodiment of this invention in which two of three drivers go into operation at a time different from the third.

However, when the three driver transistors 55, 56 and 57 operate randomly, drawn-out electromagnetic traveling waves cause 67% of minus reflection because the characteristic impedance at the confluence appears to be ⅓ looked from each of the driver transistors. FIG. 9 shows results of a simulation, similar to the simulation shown in FIG. 8B, of a case in which two of the three driver transistors 55, 56 and 57 turn on first. FIG. 9 shows that reflected electromagnetic waves propagate to two right-hand signal lines. The voltage of the main power-supply into which the branch power-supply/ground pair transmission lines 51, 52 and 53 merge becomes significantly lower. This itself does not cause any problem. However, a time lag between traveling-waves propagating through the branched power-supply/ground pair transmission lines becomes large and the TEM mode is distorted, resulting in weak coupling and causing problems of electromagnetic radiation and influence to environment to cause resonance.

Figure 10A:
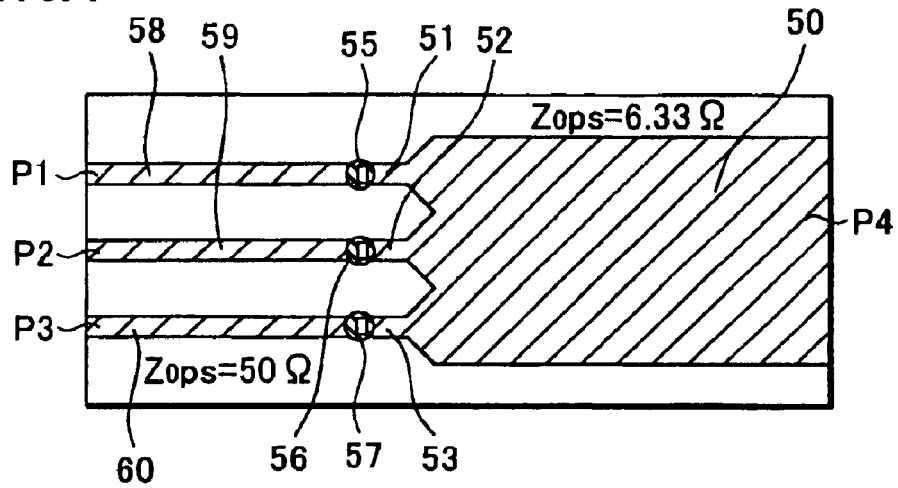
FIGS. 10A and 10B show results of simulation of propagation of electromagnetic waves when characteristic impedance $Z_{0ps}$ of the power-supply/ground pair transmission lines is small.
Figure 10B:
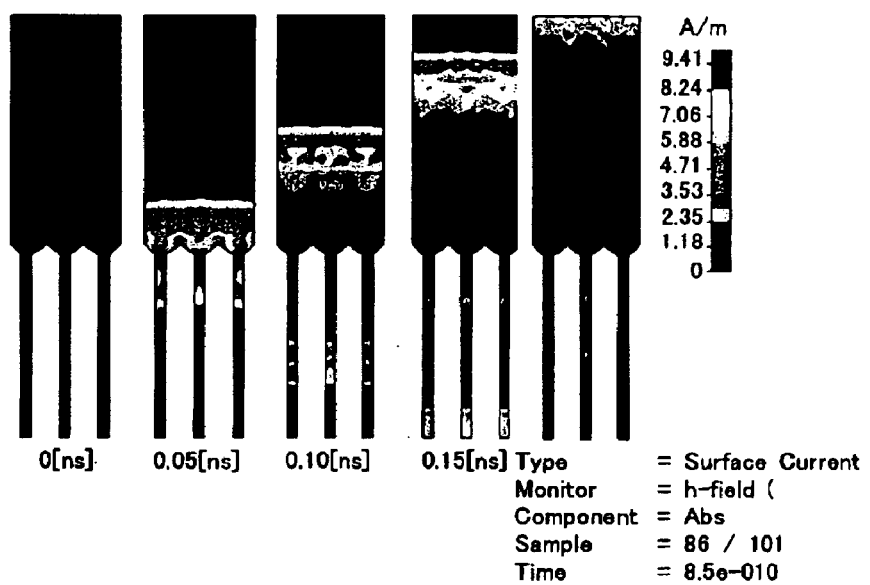
Figure 11:
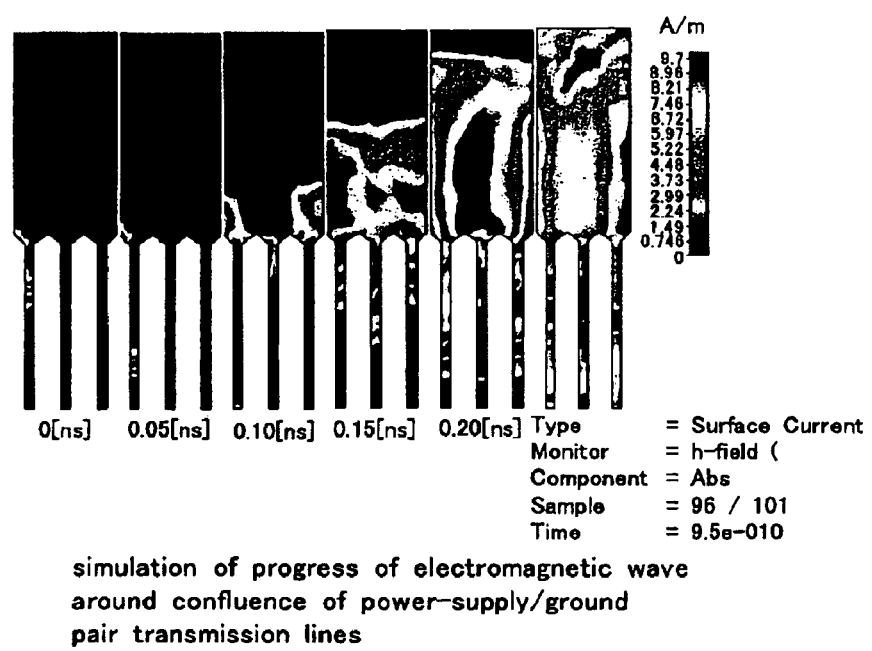
FIG. 11 shows results of simulation of propagation of electromagnetic waves when there are time lags among turn-on timings of driver transistors.

Next, a similar simulation is made under a condition that the main power-supply/ground pair transmission lines 50 wider than the branch power-supply/ground pair transmission lines 51, 52 and 53 has a lower characteristic impedance $Z_{0ps}$ of 6.33 Ω. Results are shown in FIG. 10B. The results show that the TEM transmission mode of the electromagnetic wave in the wide main power-supply/ground pair transmission lines 50 is not much distorted and the power-supply is kept at a good condition. As shown in FIG. 11, however, simulation results of a case in which there is difference in turn-on timing among three driver transistors are worse than the results shown in FIG. 9, showing distorted electromagnetic waves which can not be called traveling waves. FIG. 11 shows that plane fluctuation appears in the power-supply/ground, the TEM procession is totally distorted and resonances such as eddy currents appear here and there. It was revealed here that most of EMI (Electromagnetic Interference) of a board with a clock frequency higher than several hundred MHz comes from a power-supply/ground plane structure.

Energy of electric signal corresponds to generation of lines of electric force and lines of magnetic force. A traveling wave, an electromagnetic field of which extends only perpendicular to a traveling direction of the energy of electric signal is called a TEM wave (Transverse Electromagnetic Wave). It is an ideal form for a signal traveling through a transmission line, eliminating loss of energy to outside. The TEM wave is kept according to the simulation results shown in FIG. 8B. Adopting the power-supply/ ground pair transmission lines makes the power supply close to the ideal power-supply which can realize $L_s$=0. However, this adoption has been realized, considering the problem of impedance mismatching of the power-supply/ground pair transmission lines, in other words, difficulty in keeping the TEM wave.

Figure 12A:
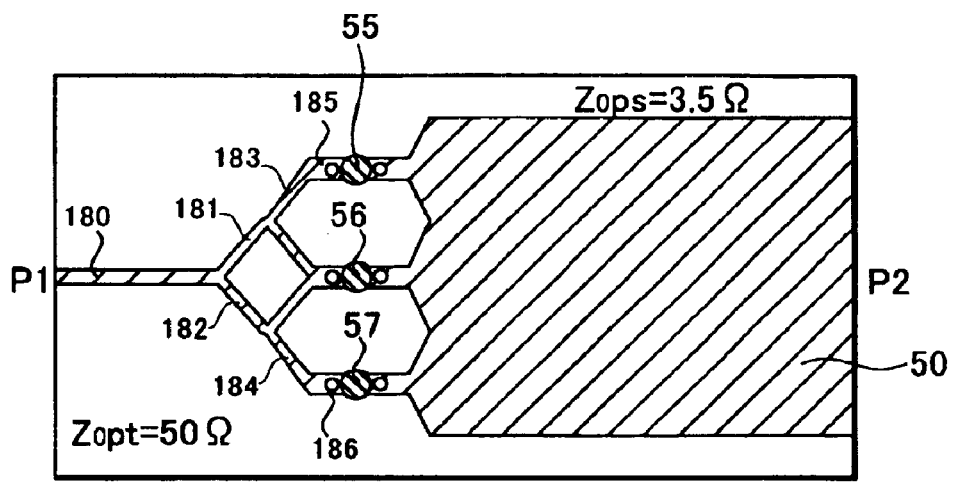
FIGS. 12A and 12B show results of simulation for branched network wirings in an embodiment of this invention.
Figure 12B:
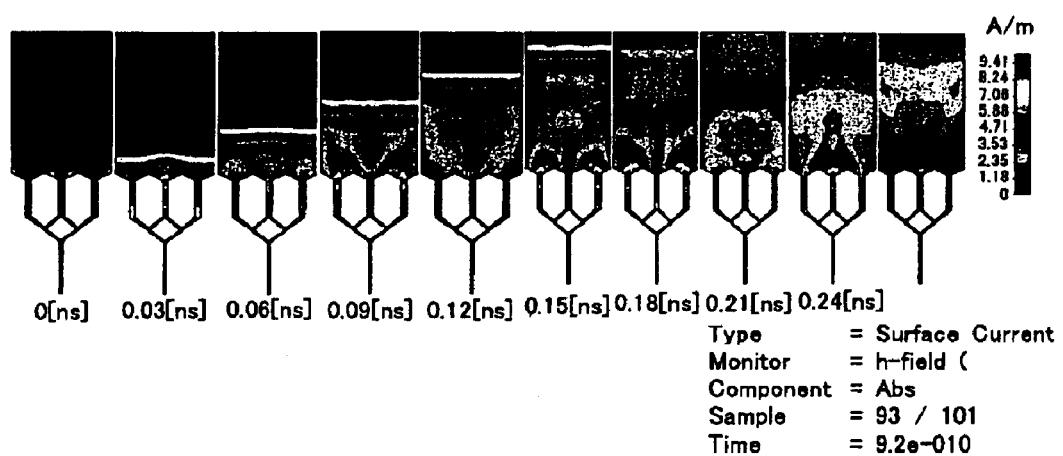

A network wiring which shows least mismatching in the characteristic impedance of the transmission line is suitable for a power-supply structure having many branches and driver transistors operating with random timing, in order not to disturb the traveling wave. An example by simulation is shown in FIGS. 12A and 12B.

The simulation is made on a case in which charge is drawn out from the port P1 through a line with practically no transistor connected thereto by reducing resistance of the transistor from 200 Ω to 5 Ω. The TEM wave is not distorted despite the change in the characteristic impedance from 50 Ω to 3.5 Ω, although the waveform is made sluggish as a secondary traveling wave and then a tertiary traveling wave emerge following a primary traveling wave. The line 180 having a resistance of 50 Ω made of a network line which causes little impedance mismatching is divided into two branch lines 181 and 182 each having a resistance of 75 Ω. From the line having the resistance of 50 Ω, the branched lines have a resistance of 37.5 Ω, and the energy reflection factor Γ becomes −14.3% from equation:

$$\Gamma=(50-37.5)/(50+37.5)$$

Each of next branched lines has a resistance of 55 Ω, and the energy reflection factor Γ becomes −15.3% from equation:

$$\Gamma=(75-55)/(75+55)$$

Two lines 183 and 184 on both sides are expanding lines (a resistance of each line is reduced to 35 Ω) connected to parallel straight lines 185 and 186. Each of the parallel straight lines 185 and 186 has a resistance of 20 Ω and merges into the main power-supply/ground pair transmission lines 50 having a resistance of 3.5 Ω with an expansion angle of 60 degrees. In this structure, the electromagnetic wave travels without major reflection as a whole, and the reflection energy takes the same return time because the line lengths to a discontinuous portion (branching portion of the lines) are the same and the reflected waves as the secondary wave and the tertiary wave are also TEM waves.

The line structure described above is detected to making the energy reflection factor relatively small, preferably making the energy reflection factor Γ less than −20%. The characteristic impedance shifts to lower impedance from one type of wiring line to another by constructing the network lines of this form, making the time to reach the main power-supply/ground pair transmission lines 50, which make a confluence layer, independent of route and making the network so that the total number of the reflections at the discontinuous portions is the same for all the discontinuous portions.

Figure 13:
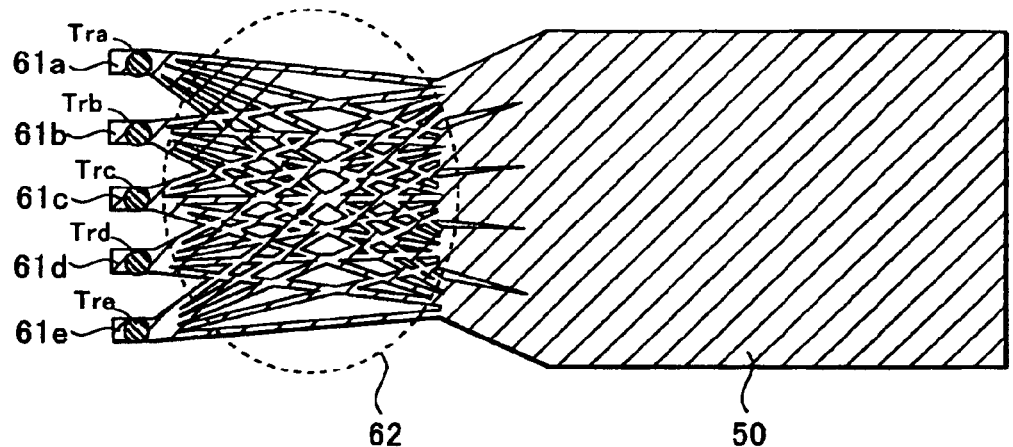
FIG. 13 is a plan view showing branched network wirings in an embodiment of this invention.

A preferable example for five inputs is shown in FIG. 13. Each of five branch power-supply/ground pair transmission lines 61a through 61e is connected to each of drivers transistors Tra through Tre. Five transmission pair lines extend from each terminal of the branch power-supply/ ground pair transmission lines 61a through 61e toward the main power-supply/ground pair transmission lines 50 to form network lines 62. The network lines 62 merge into the main power-supply/ground pair transmission lines 50.

Characteristic impedance of each of the five branches is preferably between five times (250 Ω because of five branches) and 3.5 times (175 Ω, minus reflection of −17.6%) as the characteristic impedance connected to the driver side (assumed to be 50 Ω at connecting portion with the driver). The main power-supply/ground pair transmission lines 50 have a characteristic impedance of 3 Ω in this example. Notwithstanding the above, 50 Ω/5=10 Ω is enough for the characteristic impedance, and the line width can be reduced to ⅓ of width shown in FIG. 13.

There are many intersections in the network lines 62. It is preferred that the characteristic impedances are matching at each of the intersections. Since at least two lines cross at each of the intersections, there are at lest two input lines coming in to each of the intersections and at least two output lines outgoing from each of the intersections. When Zin represents an average characteristic impedance of the two input lines and Zout represents an average characteristic impedance of the two output lines, and if Zin=Zout, the energy reflection factor Γ=(Zout−Zin)/(Zout+Zin)=0. Or if the energy reflection factor Γ of 10% or less is allowed, the following relation holds.

$$(Zout-Zin)/(Zout+Zin) \leq 10\%$$

The relation is satisfied when Zin≦Zout≦1.2Zin. Zin denotes a characteristic impedance of the lines of the branch power-supply/ground pair transmission lines side while Zout denotes a characteristic impedance of the lines of the main power-supply/ground pair transmission lines 50 side in the above example. Hereby, the excessive reflection of a traveling wave does not take place as a whole and eddy current is prevented from occurring in the network lines 62.

Figure 14:
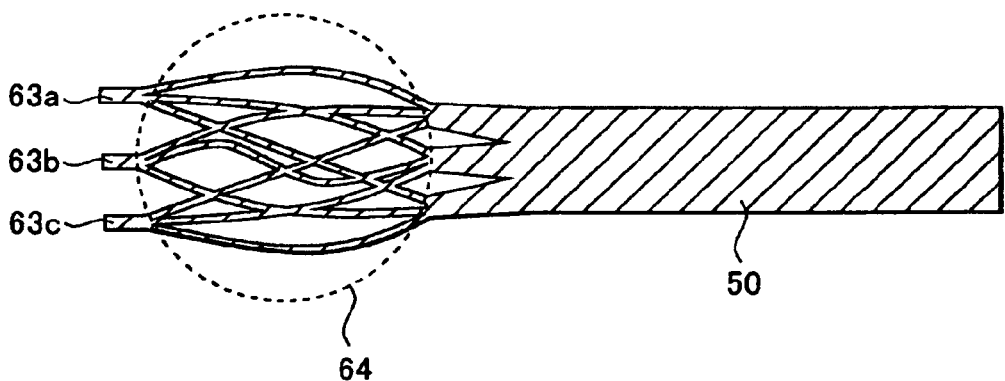
FIG. 14 is a plan view showing branched network wirings in an embodiment of this invention.

Although the lines in the network lines 62 branched off from each of the branch power-supply/ground pair transmission lines 61a–61e are not equal in length in FIG. 13, it is possible to make the length of the lines of shallow angle equal by giving each of them a slight curvature. This is shown in FIG. 14 as a structure of three merging lines. Three transmission lines extend from each terminal of the three branch power-supply/ground pair transmission lines 63a, 63b and 63c toward the main power-supply/ground pair transmission lines 50 to form network lines 64. The network lines 64 merge into the main power-supply/ground pair transmission lines 50. And each of the lines in the network lines 64 has an identical length. When the confluence is made ⅓ in width in FIG. 13, the lines can be regarded as equal in length even if they are straight, because spreading angles are shallow.

Figure 15:
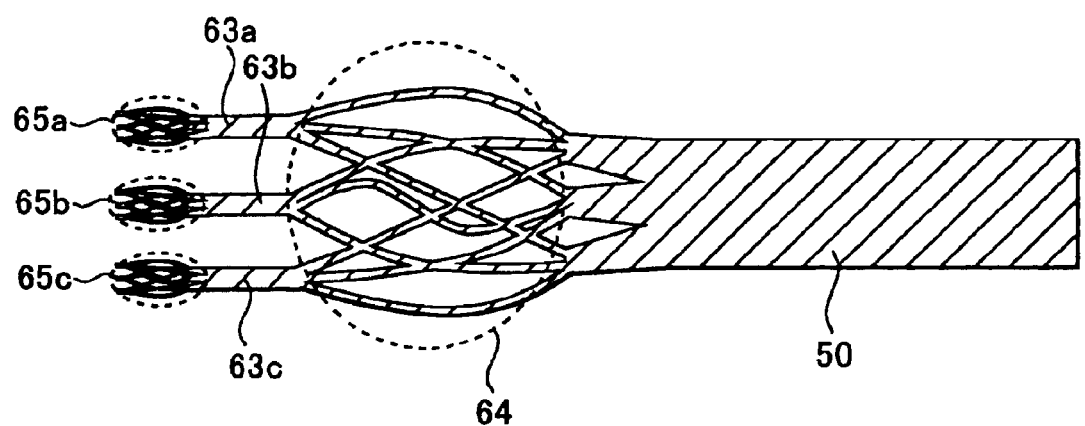
FIG. 15 is a plan view showing branched network wirings in an embodiment of this invention.

Further merging line structure is shown in FIG. 15. The structure is extended from the structure shown in FIG. 14 by connecting each of network lines 65a, 65b and 65c to each of the three branch power-supply/ground pair transmission lines 63a, 63b and 63c, respectively. Free design is possible by repeating the procedure.

Figure 16:
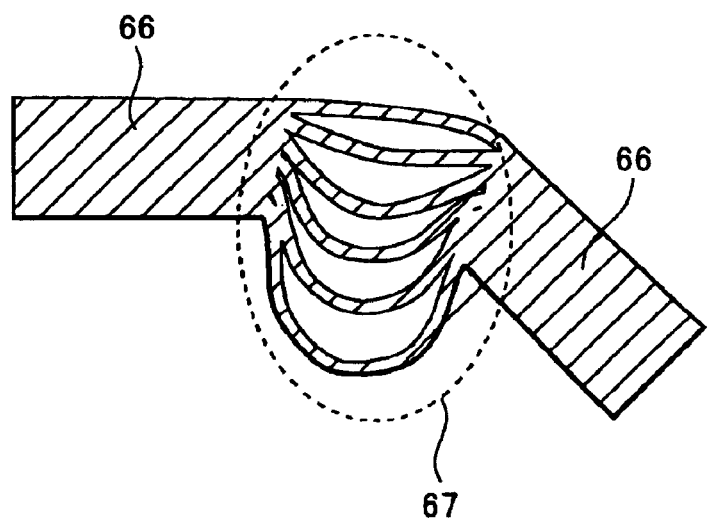
FIG. 16 is a plan view showing branched network wirings in an embodiment of this invention.

The bending of the thick pair transmission lines must be carefully designed. A shallow angle bend is relatively easy by using the branched lines and making them equal in length. An example is shown in FIG. 16. Power-supply/ground pair transmission lines 66 are bent using six branched lines 67. It is an example for a 45 degree angle bend.

Figure 17:
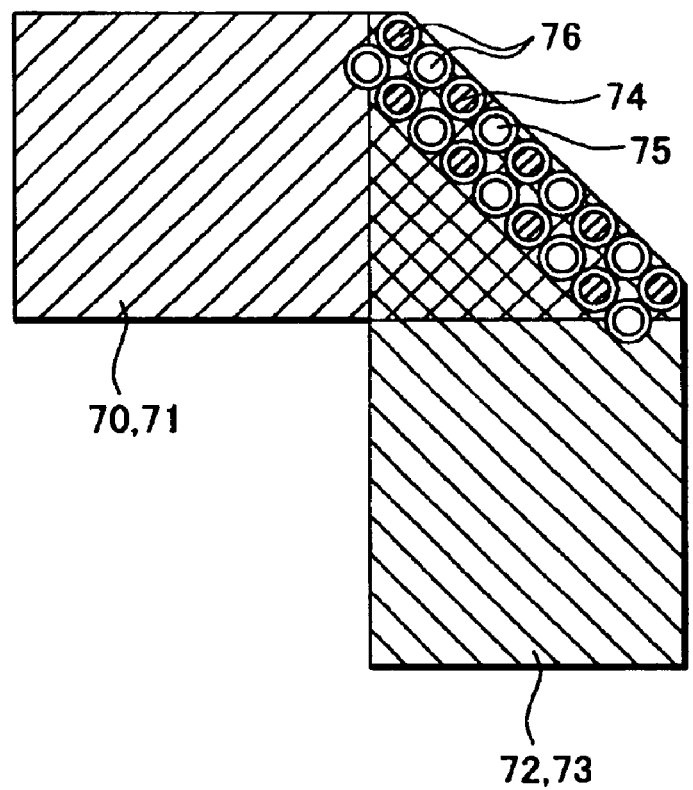
FIG. 17 shows a structure of 90 degree folded power-supply/ground pair transmission lines in an embodiment of this invention.

An example structure of the pair transmission lines bent at a right angle is shown in FIG. 17. Since double layer pair lines are used in the stacked pair lines structure, they are converted into other two layers of double layer pair lines when bent at a right angle. A pair of a first layer line 70 and a second layer line 71 is converted into a pair of a third layer line 72 and a fourth layer line 73, for example. The first layer line 70 and the third layer line 72 are connected through a via hole 74, while the second layer line 71 and the fourth layer line 73 are connected through a via hole 75. In this instance, providing anti via holes 76 is necessary to avoid a counterpart line corresponding to each of the via holes 74 and 75.

Although the finer the better a pitch between the via holes 74, 75 and 76 is, it is in a designable range because the reflection factor of about ±20% is allowed as described above. Since the via holes are disposed in a staggered configuration, a vertical structure is also formed as transmission lines.

At a turn-on timing of each of the driver transistors, a myriad of TEM mode traveling waves including each of reflected waves proceed. Attention should be paid to prevent the reflection occurred at the branch point or the like from falling into a section which causes resonance with the traveling wave. There arises no problem as long as a maximum dimension in the branch network does not exceed a quarter of a wave length corresponding to a frequency of the traveling wave.

The length of the branch network preferably does not exceed a quarter of the wave length corresponding to the frequency of the traveling wave. Under a condition that there is no reflection resonance, there is no leakage of electromagnetic energy to outside. In other words, there is no electromagnetic emission from the power-supply/ground. Thus the problem of EMI is solved completely.

However, imposing the complicated branching causes a problem to increase complexity in manufacturing process. This problem is eliminated by adding a capacitor transmission line between upper and lower lines of the branching portion of the power-supply/ground pair transmission lines, so that a part of high frequency current flowing there is removed, as shown in FIGS. 18A and 18B.

Figure 18A:
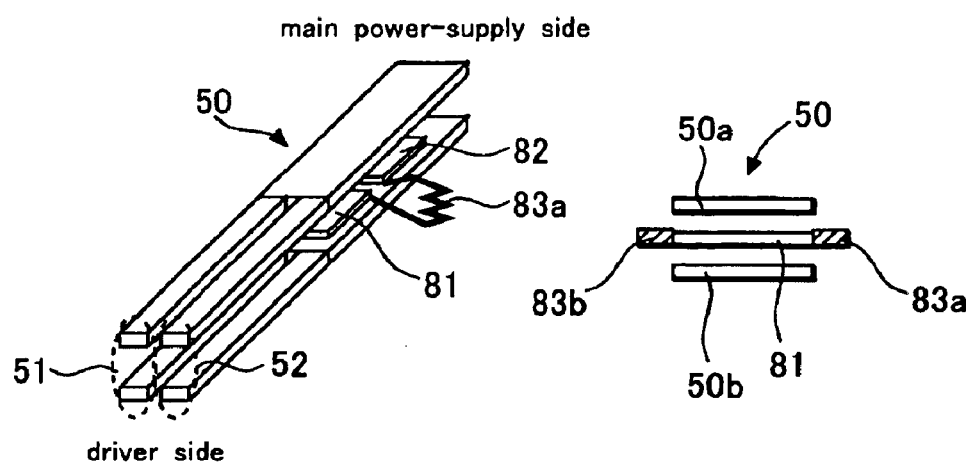
FIGS. 18A and 18B show a concept of a resister-capacitor circuit which absorbs high frequency energy in an embodiment of this invention.
Figure 18B:
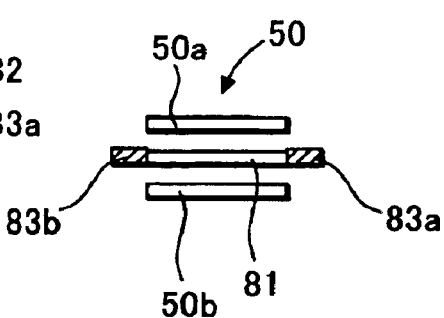

FIG. 18A is an oblique perspective figure showing the branching portion of the power-supply/ground pair transmission lines, and FIG. 18B is a cross-sectional view of the main power-supply/ground pair transmission lines 50. Only two branch power-supply/ground pair transmission lines 51 and 52 branched off from the main power-supply/ground pair transmission lines 50 are shown in FIG. 18A, omitting the other branch power-supply/ground pair transmission lines 53 in order to make the figure easy to look at.

Only measure to absorb the high frequency component energy of the shock-wave-like traveling wave traveling through the main power-supply/ground pair transmission lines 50 is converting the energy into thermal energy. Typically, this is accomplished by inserting a DC resistance. However, it is not possible to consume a DC current. Thus, two capacitor electrodes 81 and 82 are inserted between the power-supply line 50a and the ground line 50b of the main power-supply/ground pair transmission lines 50 before the branching and the capacitor electrodes 81 and 82 are connected with each other through resistors 83a and 83b, as shown in FIGS. 18A and 18B. With this, the high frequency component of the shock-wave-like traveling wave conveyed through the main power-supply/ground pair transmission lines 50 flows into the capacitor electrodes 81 and 82. The high frequency wave, which is also a traveling wave, flows into the resistors 83a and 83b and is absorbed. The higher the frequency of a harmonic component of the traveling wave is, the more it is absorbed there, since it is absorbed in the terminating resistance every time it repeats reflection because both ends of the capacitor electrodes 81 and 82 are open. The energy of the high frequency component is condensed within a short period of time, and is small energy in general.

Figure 19:
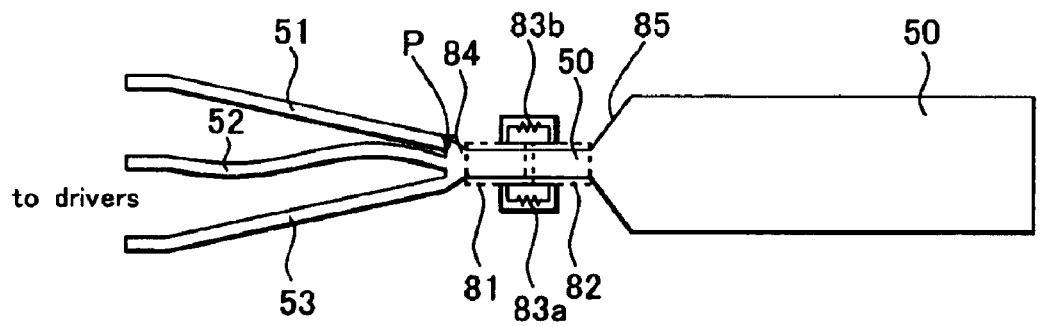
FIG. 19 is a plan view showing the resister-capacitor circuit which absorbs high frequency energy in an embodiment of this invention.

A structure to seek matching the characteristic impedance is required as shown in FIG. 19 in order to prevent reflection of the traveling wave. That is, a width of the main power-supply/ground pair transmission lines 50 must be thinner than a total width of all the branch power-supply/ground pair transmission lines 51, 52 and 53 summed up. This is because the characteristic impedance is reduced since the capacitor electrodes 81 and 82 are provided.

Also, line widths at ends of the capacitor electrodes 81 and 82 need be wider because the characteristic impedance becomes higher there. Therefore it is necessary to provide the main power-supply/ground pair transmission lines 50 with narrowing down portion 84 and expanding portion 85, as shown in FIG. 19. Lengths of the narrowing down portion 84 and the expanding portion 85 are determined so that the transmission delay of the traveling wave is ⅐ of rising time tr of the traveling wave. Since the harmonic component is reduced compared with matching transmission line branching and merging shown in FIGS. 13–17, its effect is reduced at the narrowing down portion 84 and expanding portion 85.

Figure 20A:
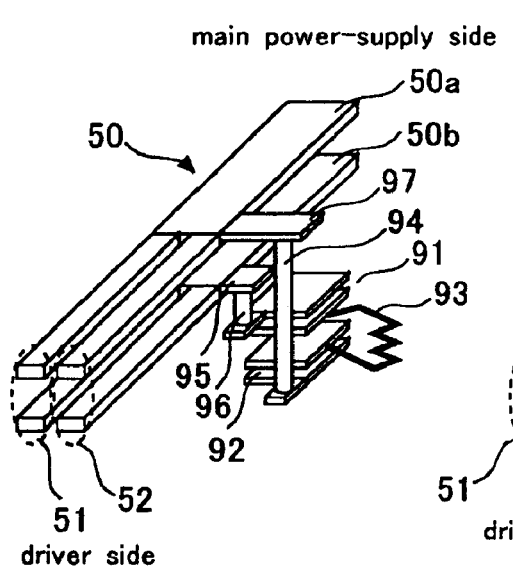
FIGS. 20A, 20B and 20C show concepts of other resister-capacitor circuits which absorb high frequency energy in an embodiment of this invention.
Figure 20B:
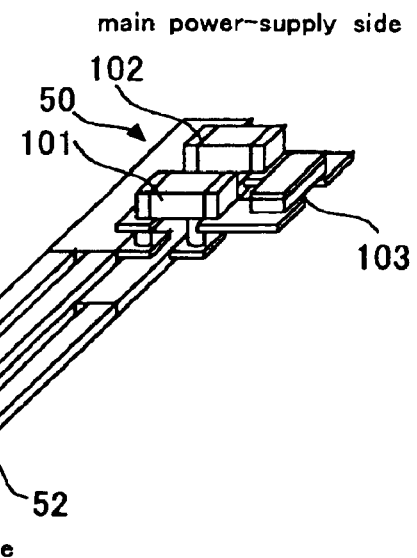
Figure 20C:
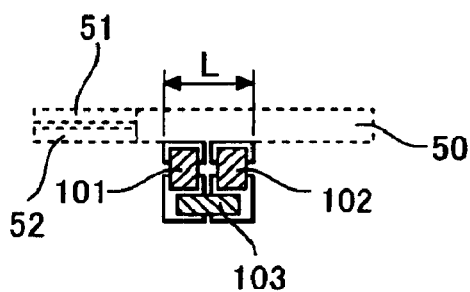

Structures shown in FIGS. 20A–20C are for avoiding complexity due to providing the narrowing portion 84 and the expanding portion 85. FIG. 20A shows a structure in which a capacitor-resistor circuit is provided in a chip. FIG. 20B shows a structure in which an external capacitor-resistor circuit is provided to a printed circuit board. FIG. 20C is a plan view of the structure shown in FIG. 20B.

Only two branch power-supply/ground pair transmission lines 51 and 52 branched off from the main power-supply/ground pair transmission lines 50 are shown in FIGS. 20A–20C omitting the other branch power-supply/ground pair transmission lines 53 in order to make the figures easy to look at.

In the structure shown in FIG. 20A, two capacitors 91 and 92 are inserted in series between the power-supply line 50a and the ground line 50b of the main power-supply/ground pair transmission lines 50 before the branching off point and a resistor 93 which connects the two capacitors 91 and 92 in series is provided. To describe more in detail, an extended portion 97 pulled out from the power-supply line 50a of the main power-supply/ground pair transmission lines 50 is connected with one electrode of the capacitor 92 through a vertical column 94 while on the other hand an extended portion 95 pulled out from the ground line 50b is connected with one end of the capacitor 91 through a vertical column 96. The capacitors 91 and 92 are stacked to make a vertical structure. However they may be configured on the same plane to make a horizontal structure.

In the structure shown in FIG. 20B, two external chip capacitors 101 and 102 are inserted in series between the power-supply line 50a and the ground line 50b of the main power-supply/ground pair transmission lines 50 before the ranching off point and an external resistor 103 which connects the two capacitors 101 and 92 in series is provided.

A capacitance of each of the capacitors shown in FIG. 19 and FIGS. 20A–20C is not required to be large. A capacitance with a capacitance 50 times as much as that of the transmission lines of the same length as the capacitors (a length L in FIG. 20C) is enough. Assuming dimensions of a printed circuit board and a characteristic impedance $Z_{0p}$=10 Ω, the line width is 0.5 mm, thickness of the insulating layer between the pair lines is 30 μm and L=1 mm for the 0603 type chip capacitor, thus the capacitance from the transmission lines is 0.7 pF. If the capacitance of each of the pair of capacitors is 35 pF, that is enough.

For example, if a frequency of the traveling wave is 10 GHZ (same as a clock frequency but includes a harmonic of a higher frequency), the impedance Z is 1/(2π×10 G×35 p)=45 Ω, thus most of the high frequency wave is converted into heat to be consumed in the added branch circuit. When the frequency is of the order of 1 GHZ, a capacitance 500 times as much as that of the transmission lines of the length L is enough. As L is small in a chip, even smaller capacitance is enough for the capacitors in the chip consequently. Although a resistance equal to the impedance Z is enough for the resistor, it is adjustable in a range up to 50 Ω which is 100 times as the impedance Z in order to avoid instantaneous heat generation.

Figure 21A:
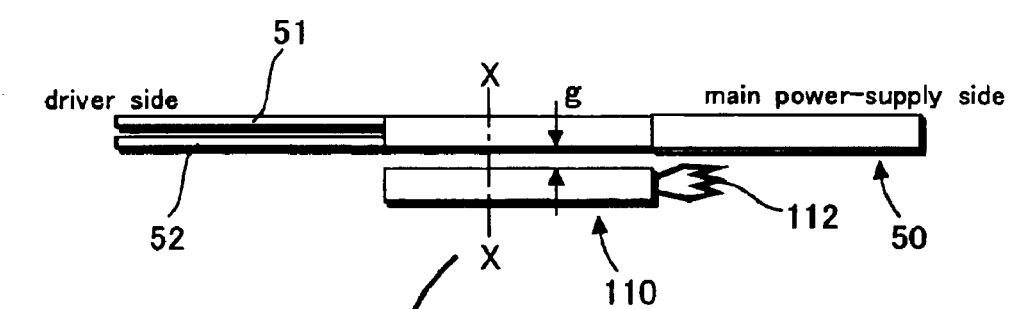
Figure 21B:
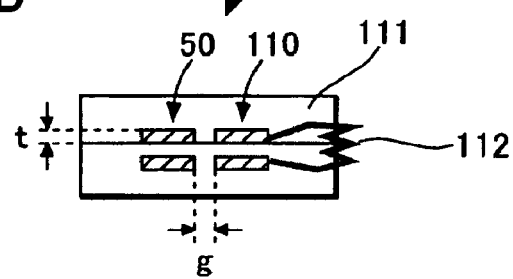

As preferable structure to absorb the high frequency component energy of the shock-wave-like traveling wave traveling through the main power-supply/ground pair transmission lines 50 is a structure having a directional coupler 110 through which the high frequency traveling wave in the main power-supply/ground pair transmission lines 50 is let out and a matching resistance provided at ends of the directional coupler. The structure is shown in FIGS. 21A and 21B. FIG. 21A is a plan view showing the power-supply/ground pair transmission lines 50 provided with the directional coupler 110. FIG. 21B is a cross-sectional view showing section X—X in FIG. 21A.

The directional coupler 110 is provided adjacent the main power-supply/ground pair transmission lines 50 before the ranching off point into the branch power-supply/ground pair transmission lines 51 and 52. The directional coupler 110 is also composed of pair lines having same structure as the main power-supply/ground pair transmission lines 50, and is disposed keeping a distance g from the main power-supply/ground pair transmission lines 50. The main power-supply/ground pair transmission lines 50 and the directional coupler 110 are buried in an insulating layer 111. The terminating resistance 112 is connected between the pair lines of the directional coupler 110.

With this structure, only high frequency energy is let out to the directional coupler 110 and direct current goes from the main power-supply/ground pair transmission lines 50 to drivers connected to the branch power-supply/ground pair transmission lines 51 and 52 without attenuation. Quasi-TEM lines are shown as an example of the directional coupler in the embodiment. The GHz frequency energy shifts to the directional coupler 110 if the distance g is equal to or less than a thickness t of a conductor of the lines.

Figure 22:
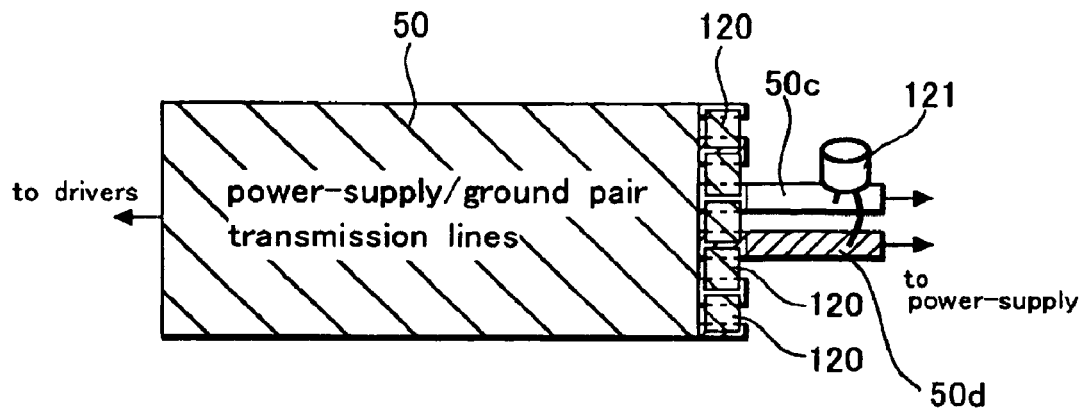
FIG. 22 shows an example structure of terminating portion of main power-supply/ground pair transmission lines in an embodiment of this invention.

Finally, a portion where the main power-supply/ground pair transmission lines 50 reaches to a main power-supply is described referring to FIG. 22. Many chip capacitors 120 which make bypass capacitors are connected to a plurality of terminals at an end of the main power-supply/ground pair transmission lines 50. A partial power-supply line 50c and a partial ground line 50d are led out and connected to a power-supply circuit (not shown) through a large-capacitance condenser such as an electrolytic condenser 121.

Buried capacitors can be used instead of the chip capacitors 120. The buried capacitors are connected as a row of capacitors having homogeneous connecting terminals provided in a semiconductor in an LSI chip. A plurality of chip capacitors having capacitances ranging from 1 nF to 100 nF are disposed over the entire end face making total capacitance matching with maximum current capacity of the supplied side to satisfy conventional idea.

Now an electromagnetic traveling wave traveling in the above structure is considered. Charge is drawn out at a switching speed of a driver transistor connected to the main power-supply/ground pair transmission lines 50, and a current I is determined by the ON-resistance $R_{on}$ of the driver transistor and $V_{dd}$ flows as follows:

$$I=V_{dd}/R_{on}=1\ V/200\ \Omega=5\ mA$$

Immediate response is obtained regardless how quickly the transistor switches, if I is smaller than the maximum allowable current, $I_{max}=V_{dd}/Z_{0p}=1\ V/50\ \Omega=200$ mA. When the driver transistor is assumed to switch in 30 ps, a rate of current variation di/dt is calculated by following equation:

$$di/dt=5\ mA/30\ ps=0.17\times10^9\ A/s$$

Figure 23A:
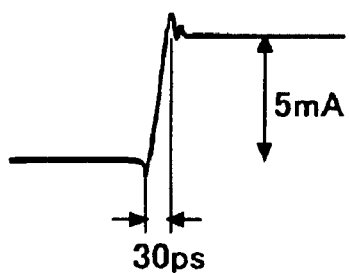
FIGS. 23A and 23B show waveforms of electric current through the driver and electric current through the power-supply/ground pair transmission lines.

With the 0603 type chip capacitor 120 described above and having $L_s$=270 pH, $V_{drop}$ becomes 46 mV/driver resulting in incapability of driving a plurality of driver transistors. FIG. 23A shows a typical current which drives a receiver circuit having a terminating resistance of 50 Ω.

Figure 23B:
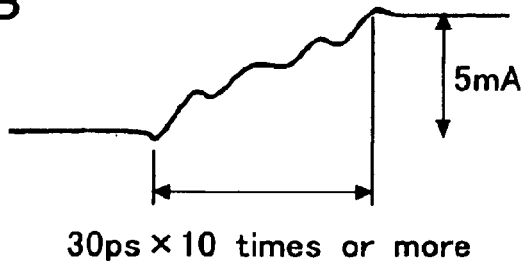

Although a steep waveform is applied to the main power-supply/ground pair transmission lines 50 under a condition that the current is the maximum allowable current $I_{max}$ or less, it is easily conceivable that the rising time tr becomes 10-hold of 30 ps as shown in FIG. 23B, after the reflection is repeated at branched and expanded lines and the energy is broadened in terms of time. Even though the waveform is modified, the TEM mode is kept and charge distribution is thinned in broader lines.

Because the current is received by five chip capacitors 120 which make the bypass capacitors at the end of the main power-supply/ground pair transmission lines 50 as shown in FIG. 22, the current is divided by five and the rate of current variation looked from each of the chip capacitors is di/dt=1 mA/300 ps=3.3×10⁶ A/s.

The voltage drop $V_{drop}$=3.3×10⁶ A/s×270 pH=0.9 mV is low and presents no problem. When many driver transistors send such traveling waves to the end at random and independently, the problem becomes smaller since combined wave is rather averaged. On an occasion of 64 bit simultaneous switching such as resetting, a certain degree of asymmetry causes a skew to reduce the problem to a level of 10 bit simultaneous switching. In the example calculation above, the voltage drop $V_{drop}$=0.9 mV×10=9 mV causes no problem. In the first example calculation for the ON-resistance $R_{on}$ of 500 Ω, there arises no problem even when supplied energy reaches the main power supply without the skew.

When a traveling wave reaches an edge surface of the main power-supply, how does the characteristic impedance of each of the chip capacitors 120 waiting for the wave look like? Because the power-supply/ground pair makes coupling over very wide area, its characteristic impedance is very low and of an order from several tens of mΩ to several hundreds of mΩ. The characteristic impedance of the main power-supply/ground pair transmission lines 50 which reach the main power-supply is several ohms and almost total reflection takes place.

That is, it looks a short-circuited end for a high frequency energy. The current flows backward so as to cancel the traveling wave and the voltage drop corresponding to the current traveling wave makes a high voltage wave form to cancel the voltage drop. Such a traveling wave proceeds toward the driver and charges depleted storage of electric charge in the LC ladder circuit of the main power-supply/ground pair transmission lines 50. The TEM wave is kept without disturbance in this process also, and the electric charge energy is offered to keep the electromagnetic wave status not going out of the main power-supply/ground pair transmission lines 50.

Figure 24A:
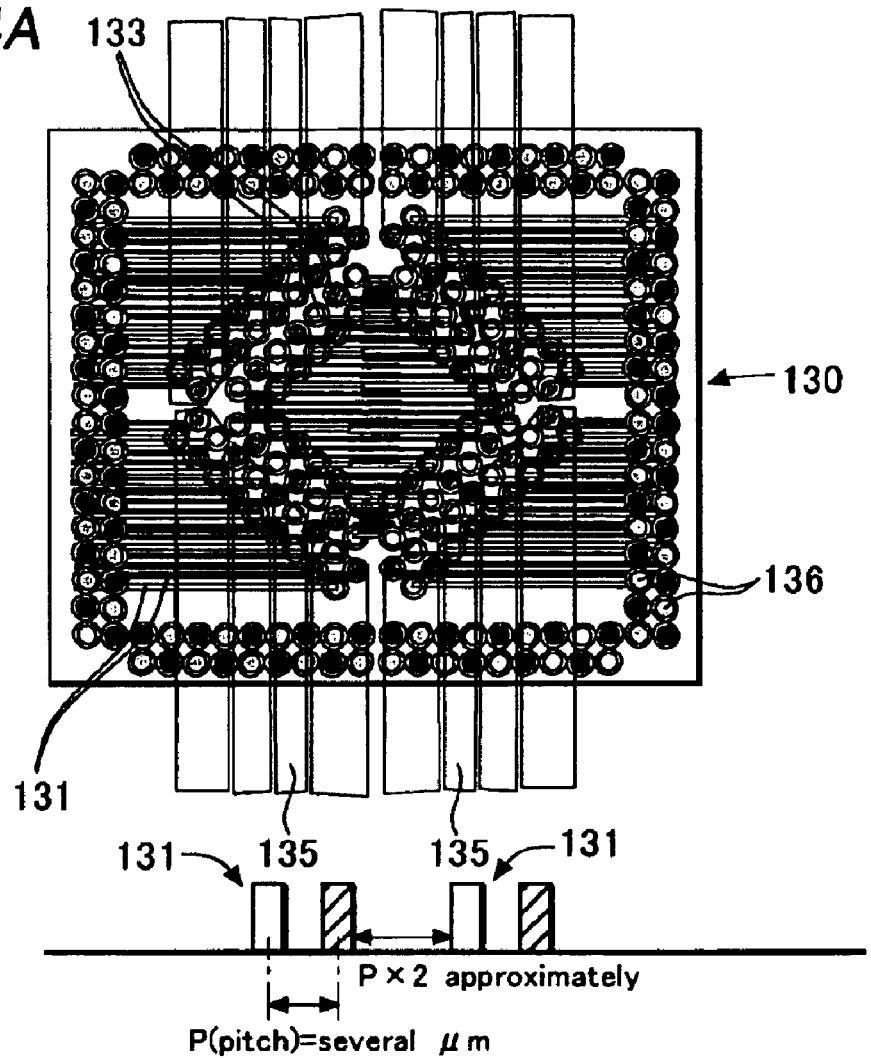
FIGS. 24A and 24B show an example of connection of power-supply/ground pair lines in a flip chip of an embodiment of this invention.
Figure 24B:
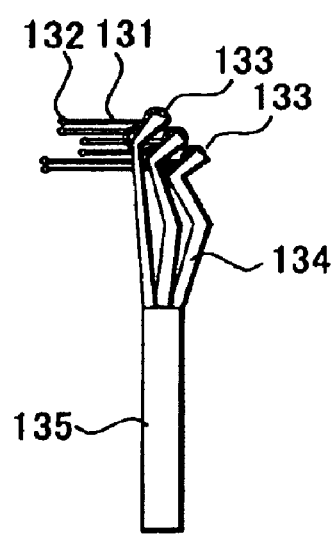

Next, another structure of the power-supply will be explained. Bending thick lines is difficult to design. Thus a preferable method is keeping thin lines of the power-supply/ground pair transmission lines without merging as long as possible and putting them together into thick lines at the very end. FIG. 24A shows a pattern layout of a flip chip offering such a power-supply structure, and FIG. 24B shows a magnified view of a part of it.

Adjacent pair lines 131 on the chip 130 are composed of a power-supply line and a ground line disposed next to each other and connected with an extraction structure of external 4 divisions×4. A portion is picked up and shown in FIG. 24B omitting lines for merge for the sake of brevity. The adjacent pair lines 131 on the chip 130 are extracted from inner lines of the chip 130 with columns 132 (the inner lines are omitted), as shown in FIG. 24B.

The adjacent pair lines 131 are connected to each of the branch power-supply/ground pair transmission lines 134 through each of bumps 133. Each of the branch power-supply/ground pair transmission lines 134 is merged into the thick main power-supply/ground pair transmission lines 135.

Two rows of bumps 136 in a periphery of the chip 130 are for signal lines. Although there are ordinary wirings to them, only the bumps 136 are shown here omitting the wirings. The adjacent pair lines 131 on the chip 130 has a large aspect ratio making area facing to each other large as shown in a cross-sectional view shown in lower portion of FIG. 24A. This is only one example of the structure.

As seen from FIGS. 24A and 24B, it is preferable that the power-supply/ground pair transmission lines are kept separated as close to the main power-supply as possible. The power-supply/ground pair transmission lines have already gone through branching and merging in the chip, and traveling wave electromagnetic energy is spread out over time or the energy is absorbed with branch capacitors. Power-supply/ground traveling wave is received by the branch capacitors as shown in FIGS. 19, 20A–20C and 21A–21B, a DC-current-like connection is enough for further connection and extracting a pair of lines from a certain location is enough for further connection, as shown in FIG. 22. However, a cross-sectional area of the conductor must be large enough for average current to flow.

Next, a circuit and lines in the chip 130 will be described. The driver circuit having N channel type MOS transistors is already presented. Similarly in a CMOS driver and other circuit shown in FIG. 25, considering only connecting portion of the power-supply/ground pair transmission lines is enough.

Figure 25:
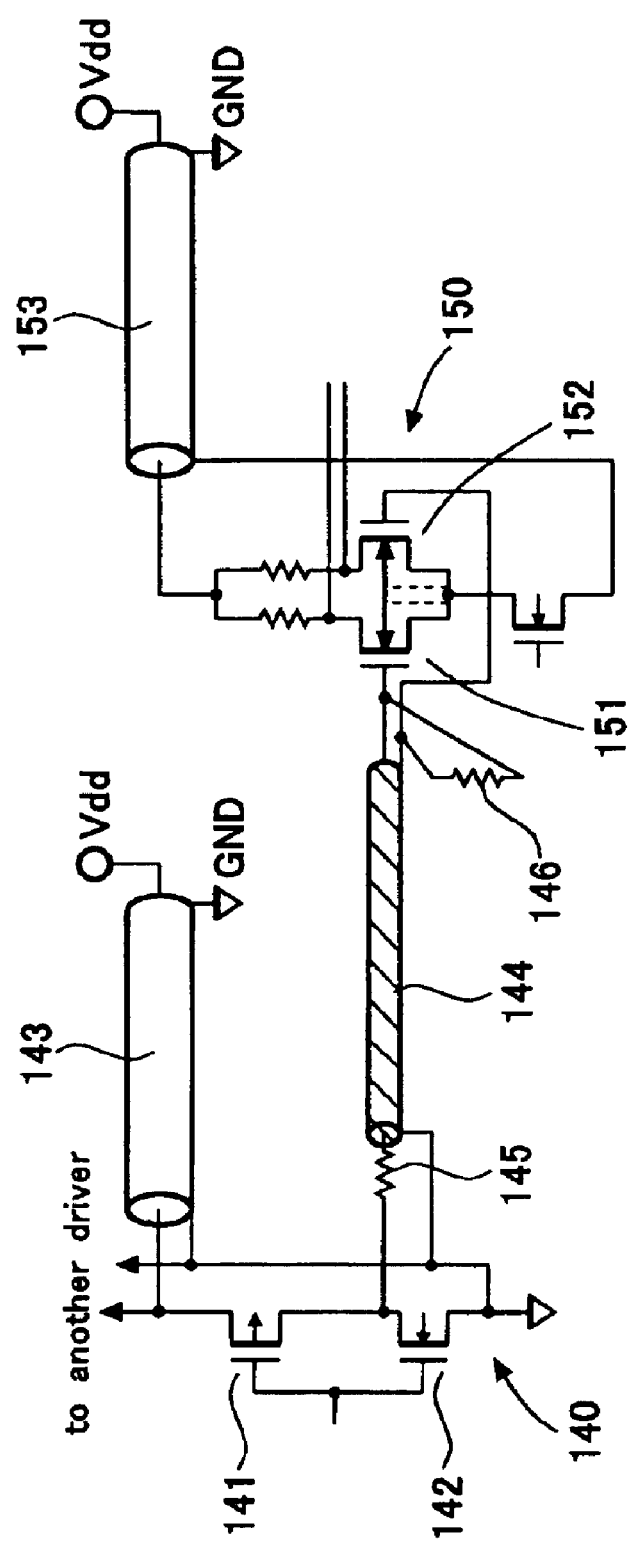
FIG. 25 shows a circuit diagram of a driver-receiver circuit in an embodiment of this invention.

FIG. 25 shows an example circuit of a driver/receiver circuit. As shown in the figure, a CMOS driver 140 includes a P channel type MOS transistor 141 and an N channel type MOS transistor 142 and power-supply/ground pair transmission lines 143 are connected to its power-supply and ground terminals.

And signal/ground pair transmission lines 144 are connected to an output and ground terminals of the CMOS driver 140. A dumping resistance 145 is connected between a signal line of the signal/ground pair transmission lines 144 and the output terminal of the CMOS driver 140.

And a terminating resistance 146 is connected to the signal/ground pair transmission lines 144. The signal/ground pair transmission lines 144 are connected to each of the gates of differential input transistors 151 and 152 of a differential receiver 150. Power is provided to the differential receiver 150 from other power-supply/ground pair transmission lines 153.

The driver/receiver circuit shown in FIG. 25 has relatively long signal lines in the chip 130, which might exceed ¼ of the wave length of a corresponding signal frequency component. Therefore, in order to suppress reflection resonance and prevent RC delay, the signal lines must be composed of transmission lines with matching resistance at 10 GHz digital signal level.

For this method, the terminating resistance 146 matching the signal/ground pair transmission lines 144 is added just before the end of the differential receiver 150 to suppress signal reflection to zero by absorbing energy and dissipating it as heat. If the terminating resistance 146 is not added to the structure, making a series resistance of the dumping resistance 145 connected to the CMOS driver 140 and an ON-resistance $R_{on}$ of the CMOS driver 140 equal to a characteristic impedance of the signal/ground pair transmission lines 144 is good enough.

This structure has an advantage to return the energy to the power-supply/ground pair transmission lines 143 since the end of the differential receiver 150 makes total reflection (considered as a total reflection because the gates of the receiver have very small capacitance) to double the voltage and all signals make total reflection.

The energy return, which increases complex fluctuation of the power-supply/ground in ordinary power-supply/ground connection, only makes TEM traveling wave in the driver/receiver circuit and presents no problem. The preferable length of such a circuit will be considered. Calculation results of long wirings, i.e. ¼ of the wave length, is shown in table 1. The results are shown according to electromagnetic wave velocity v which is expressed as follows:

$$v = c_0/\sqrt{\mu_r \epsilon_r}$$

where $c_0$ is a velocity of light in vacuum, $\mu_r$ is a relative permeability of insulating material surrounding the line space and $\epsilon_r$ is a relative permittivity of it.

TABLE 1

Minimum Length of On-Chip Wiring to be composed of Transmission Lines vs. Frequency

| Pulse Frequency [MHz] | Corresponding Harmonic Sine Wave [GHz] | (1/4)λ Line Length [m] v = 1 × 10$^8$ [m/s] | (1/4)λ Line Length [m] v = 1.5 × 10$^8$ [m/s] | (1/4)λ Line Length [m] v = 2 × 10$^8$ [m/s] |
|---|---|---|---|---|
| 5 | 0.05 | 0.5 | 0.75 | 1 |
| 10 | 0.1 | 0.25 | 0.375 | 0.5 |
| 50 | 0.5 | 0.05 | 0.075 | 0.1 |
| 80 | 0.8 | 0.0315 | 0.046875 | 0.0625 |
| 100 | 1 | 0.025 | 0.0375 | 0.05 |
| 300 | 3 | 0.008325 | 0.012485 | 0.01665 |
| 500 | 5 | 0.005 | 0.0075 | 0.01 |
| 1000 (1 GHz) | 10 | 0.0025 | 0.00375 | 0.005 |
| 10000 (10 GHz) | 100 | 0.00025 | 0.000375 | 0.0005 |
| 100 GHz | 1000 | 25 μm | 37.5 μm | 50 μm |

Figure 26:
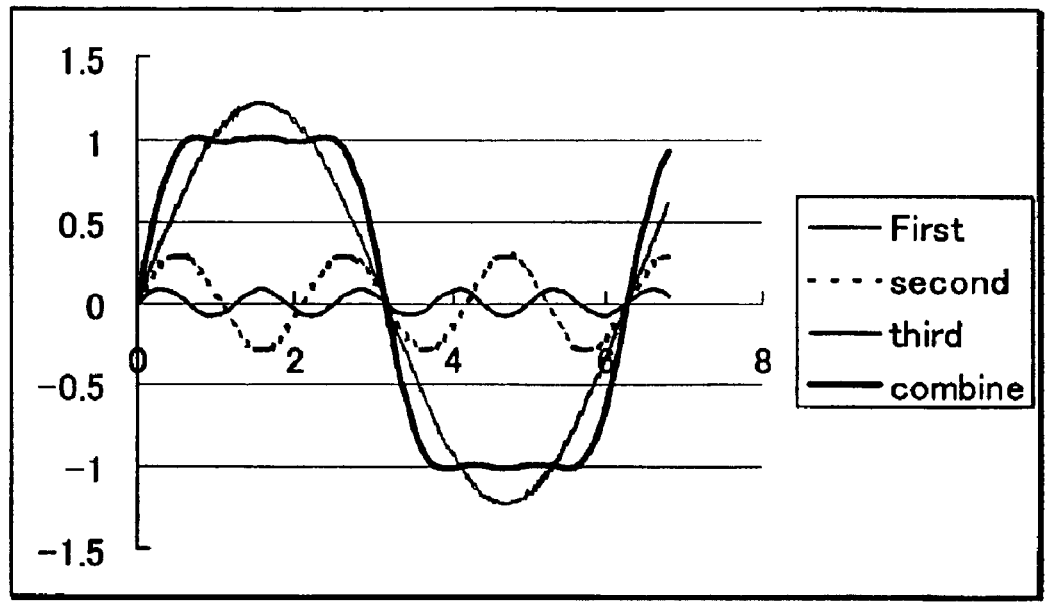
FIG. 26 shows analysis (Fourier series) of a pulse waveform.

Next, characteristics of a pulse waveform will be described referring to FIG. 26. The pulse is made of a composite of sine waves. The pulse waveform is approximately composed of a fundamental sine wave, a sine wave of three times as high as the frequency of the fundamental sine wave accounting for around 25% of the pulse, a sine wave of five times of the frequency of the fundamental sine wave accounting for about 10% of the pulse, a harmonic of seven time of the frequency of the fundamental sine wave accounting for several % of the pulse and a harmonic of nine times of the frequency of the fundamental sine wave accounting for 1% of the pulse. The higher a slew rate is the more of the pulse is composed of the higher-order harmonics.

When dealing with a pulse of 1 GHz, it is said in general that a sine wave of 10 GHz (ten times of the pulse clock frequency) needs to be taken into consideration, since even a low energy harmonic wave accumulates the energy to significant amount in resonance condition. Clock frequencies written in the leftmost column of the table 1 are related to corresponding sine waves in the second column from the left based on this view.

A maximum allowable length of wiring at the clock frequency of 1 GHz is 5 mm in SiO$_2$. An article from Intel reported at Symposium on VLSI Circuit in February 2002 (D. Deleganes, et al. "Designing a 3 GHz, 130 nm, Pentium 4 Processor," 2002 Symposium on VLSI Circuit Digest of Technical Papers, CDROM0-7803-7310-3/02, 2002.2) describes a design limiting on-chip wirings to 1.6 mm or shorter (Pentium is a registered trademark of Intel Corporation). It is a material which supports the calculation results. The maximum allowable length of wiring at 10 GHz of pulse turns to be 0.5 mm. Because equivalent frequency in a RF circuit of 100 GHz needs to be handled for the 10 GHz pulse, a design which deals with the composite waves is by far the more difficult than an RF design dealing with a single sine wave or a narrow band sine wave.

Design of on-chip wirings has to be limited by the prerequisite described above. The maximum length of wiring in a circuit block (functional block) designed with common lumped constant circuit which can be designed with a conventional CAD tool needs to be 0.5 mm or shorter. A size of the functional block is limited by the maximum length of wiring. All of wirings connecting between the blocks, which are called global wirings, must be composed of transmission lines as shown in FIG. 4 or FIG. 25. Everything has to be designed starting from wiring.

Although conventional design is good for power-supply/ground of conventionally designed lumped constant circuit block, a structure of this invention is applied to power-supply/ground lines coming from the lumped constant circuit block. That is, the power-supply/ground lines are formed of power-supply/ground pair transmission lines and are expanded or merged taking the characteristic impedances into consideration. The structure of this invention is applied to all power-supply systems of driver/receiver blocks applied to the global wirings, and needless to say, they are directly connected to sources and drains of transistors.

For a clock distribution circuit in particular, not only a signal line is made into a symmetrical structure (a tree structure, for example) of transmission line, but also the power-supply/ground pair transmission lines are made into a symmetrical structure and the clock skew is minimized.

When it is desired to terminate a thick line merged within the chip and to make a direct current connection, it is connected with chip capacitors 120 dispersed on the end surface of the thick power-supply/ground pair transmission lines 50, as shown in FIG. 22. Although the chip capacitors 120 may be PN junction capacitors formed in the chip, preferably they are capacitors with metal electrodes facing to each other. The reason is carrier velocity in the PN junction capacitors is slow, as mentioned already.

Figure 27:
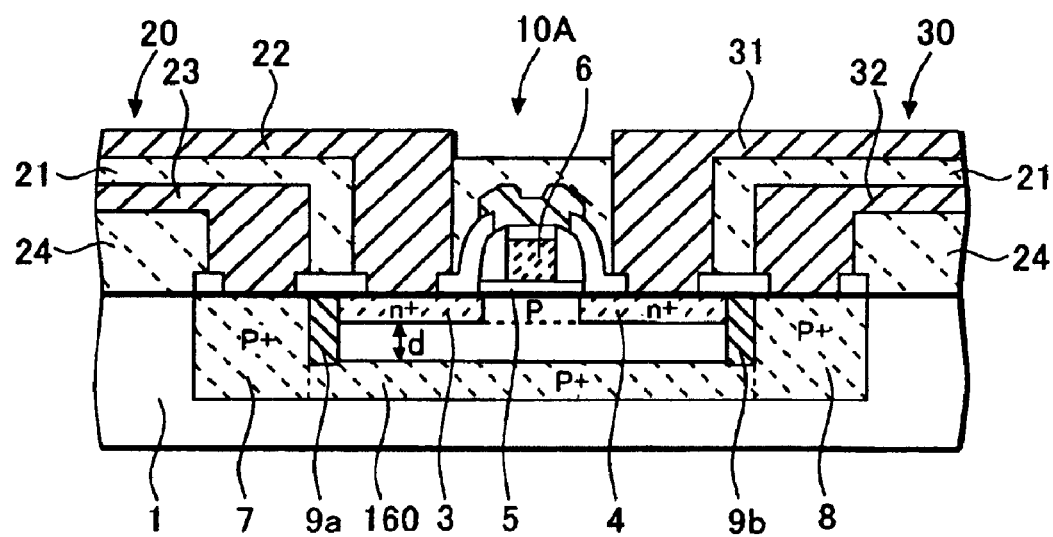
FIG. 27 is a cross-sectional view showing a structure of the driver transistor in an embodiment of this invention.

The structure of the wiring has been described in detail. It is important to make traveling of electromagnetic wave of the driver transistor 10 smooth in order to realize a power-supply structure capable of supporting high speed signals. A structure of a driver transistor 10A, which is a further improvement of the driver transistor 10 shown in FIG. 3 for this purpose, will be explained referring to FIG. 27.

The ground line 23 of the power-supply/ground pair transmission lines 20 makes contact to the drain side P$^+$ layer 7 and the ground line 32 of the signal/ground pair transmission lines 30 makes contact to the source side P$^+$ layer 8 in the structure of the driver transistor 10 shown in FIG. 3. While these structures are common to both of the driver transistors, the driver transistor 10A is different from the driver transistor 10 in that the P$^+$ layer 7 and the P$^+$ layer 8 are connected to each other through a P$^+$ layer 160 provided in a region from below the drain layer 3 through a region below the source layer 4. The P$^+$ layer 160 is formed of a diffusion layer of higher impurity concentration than the P well 2 and has lower resistance compared with the P well 2.

Figure 28:
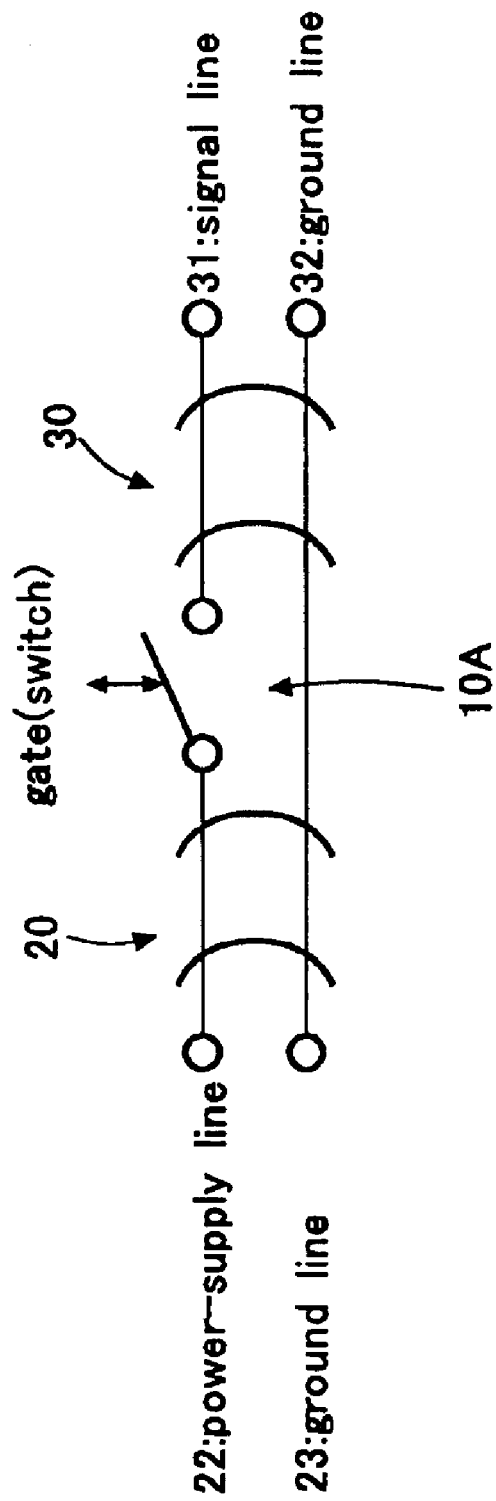
FIG. 28 is a circuit model diagram showing basic principle of the structure shown in FIG. 27.

Basic principle of operation of the driver transistor 10A is shown in FIG. 28. Since the ground line 23 of the power-supply/ground pair transmission lines 20 is connected with the ground line 32 of the signal/ground pair transmission lines 30 through the low resistance P$^+$ layers 7, 8 and 160, the pair transmission line structure is maintained in every portion of a current path when the driver transistor 10A is turned on and a channel region is inverted to form the current path.

Although it is ideal that the characteristic impedance of the structure matches the source side transmission lines, the matching is not necessarily required. It is because the distance is very short. A distance between the drain layer 3 or the source layer 4 and the P⁺ layer 160 in FIG. 27 may be zero. Because the semiconductor under the P⁺ layer 160 is not needed, it may be an insulator, that is, the driver transistor may be formed in SOI (Silicon On Insulator) structure. In order to eliminate PN junction capacitance under the drain layer 3 and the source layer 4, a layer between the drain layer 3 or the source layer 4 and the P⁺ layer 160 may be formed of an insulator. All of the P⁺ layers 7, 8 and 160 may be replaced with metal. By doing so, the ground line 23 of the power-supply/ground pair transmission lines 20 and the ground line 32 of the signal/ground pair transmission lines 30 are made to be continuous metal. To put it briefly, a structure to keep the basic principle of operation shown in FIG. 28 is proposed.

Figure 29:
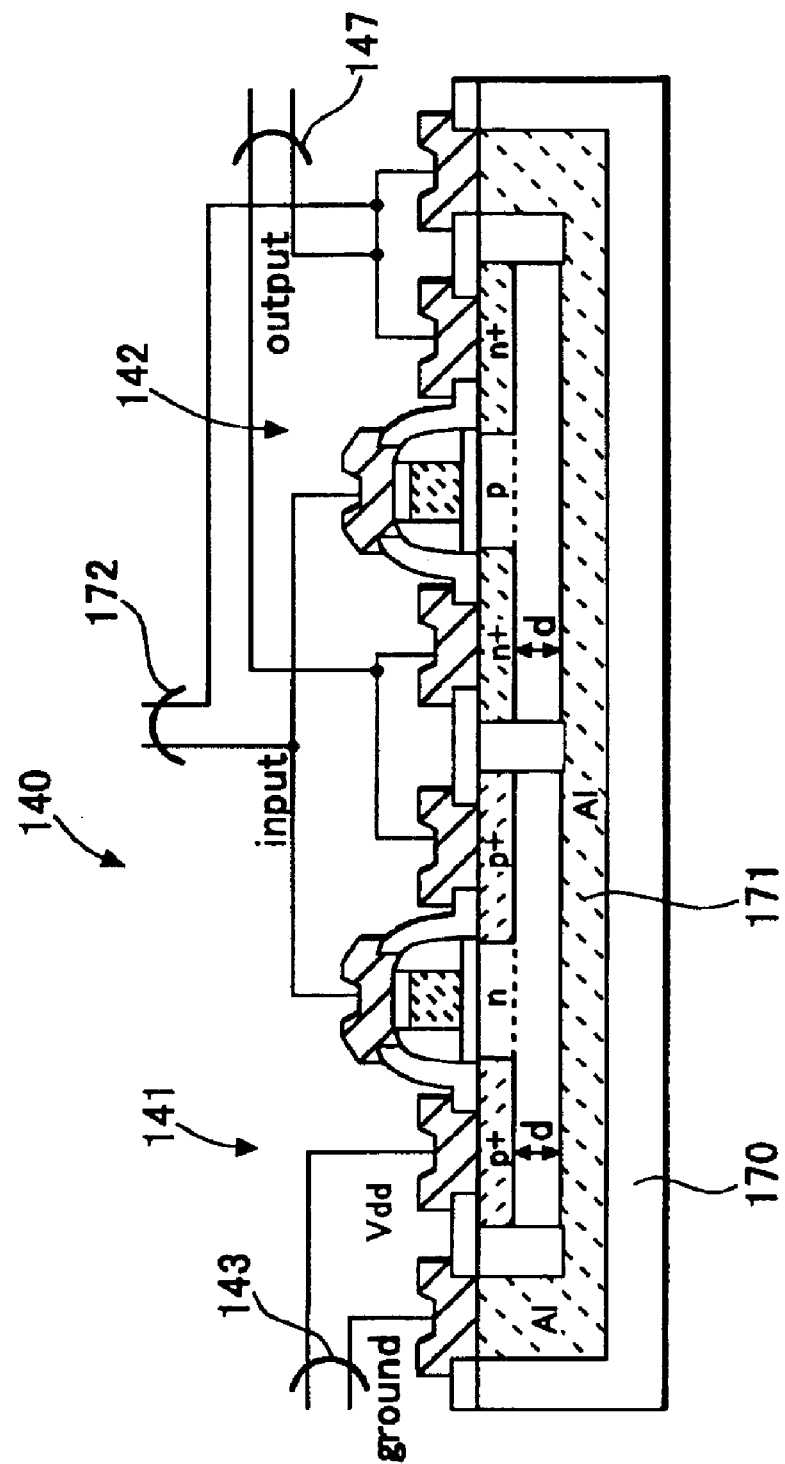
FIG. 29 is a cross-sectional view showing a CMOS driver composed of a transmission line structure in an embodiment of this invention.

FIG. 29 is a cross-sectional view showing a CMOS driver 140 of the SOI structure. A circuit of the CMOS driver 140 is the same as the circuit shown in FIG. 25. A P channel type MOS transistor 141 and an N channel type MOS transistor 142 are formed on an insulating substrate 170 in which an aluminum layer 171 connecting between a ground line of power-supply/ground pair transmission lines 143 and a ground line of signal/ground pair transmission lines 147 is formed.

In this structure, a thickness d needs to be approximately the same as a diffusion depth of a source layer and a drain layer. However, advantage of the SOI is lost because of the PN junction capacitance. Therefore, the layer having the thickness d is preferably made of an insulator. If the terminating resistance 146 is attached to output load side, charge does not move at all when the N channel transistor 142 is turned on, that is, the N channel transistor 142 makes a circuit of no use. Thus, attaching the dumping resistance 145 to the CMOS driver side makes better design to take advantage of CMOS.

In addition, by providing input signals through pair transmission lines 172, the ground line is connected to a ground of an output system, gates are charged, a channel is formed below the gate and ground level under it is balanced, bringing advantage that forming a channel of the driver transistor 10A is enhanced.

According to this invention, an electronic circuit device having a power-supply structure capable of supporting fast signals in and above the GHz band is offered.

What is claimed is:

1. An electronic circuit device comprising:
   a first pair transmission line comprising a power-supply line, a first ground line and a first insulating layer disposed between the power-supply line and the first ground line, a face of the power-supply line facing a face of the first ground line;
   a driver transistor; and
   a second pair transmission line comprising a signal line, a second ground line and a second insulating layer disposed between the signal line and the second ground line, a face of the signal line facing a face of the second ground line, and an output of the driver transistor being supplied to the signal line,
   wherein the power-supply line is directly connected to a drain layer of the driver transistor and the first ground line is connected to a substrate of the driver transistor.

2. The electronic circuit device of claim 1, wherein a wiring length of the second pair transmission line is longer than a quarter of a wave length of a harmonic of a tenfold frequency of an operational pulse frequency of the driver transistor.

3. The electronic circuit device of claim 1 or 2, wherein the signal line is directly connected to a source layer of the driver transistor and the second ground line is directly connected to the substrate of the driver transistor.

4. The electronic circuit device of claim 3, wherein a characteristic impedance of the first pair transmission line is equal to or greater than a characteristic impedance of the second pair transmission line.

5. The electronic circuit device of claim 1, wherein the first ground line is connected to the second ground line through a low resistance layer formed in the substrate of the driver transistor.

6. An electronic circuit device comprising:
   a main pair transmission line comprising a main power-supply line and a main ground line;
   a plurality of branch pair transmission lines branching off from the main pair transmission line, each of the branch pair lines comprising a branch power-supply line and a branch ground line;
   a driver transistor connected to each of the branch pair transmission lines;
   another pair transmission line comprising a signal line and another ground line, an output of the driver transistor being supplied to the signal line; and
   a receiver circuit receiving a signal transmitted from the another pair transmission line.

7. The electronic circuit device of claim 6, wherein the device is configured so that following formula applies:

$$Z_{ops} \leq Z_{opt}/n \leq 1.2 Z_{ops}$$

where n denotes a number of the branch pair transmission lines, $Z_{0ps}$ denotes a characteristic impedance of the main pair transmission line and $Z_{0pt}$ denotes a characteristic impedance of the branch pair transmission lines.

8. The electronic circuit device of claim 6, further comprising a wiring web structure connected between a group of the branch pair transmission lines and the main pair transmission line.

9. The electronic circuit device of claim 8, wherein each path between the branch pair transmission line and the main pair transmission line in the wiring web structure has a same length.

10. The electronic circuit device of claim 6, 7, 8 or 9, further comprising:
    a plurality of bypass capacitors connected to a terminal portion of the main pair transmission line;
    a supply-side pair transmission line connected to the terminal portion and comprising a supply-side power-supply line and a supply-side ground line;
    a capacitor connected between the supply-side power-supply line and the supply-side ground line; and
    a power-supply circuit connected to the supply-side pair transmission line.

11. The electronic circuit device of claim 6, 7, 8 or 9, further comprising an attenuation circuit which comprises a pair of capacitors connected between the main power-supply line and the main ground line and a resistor connecting the pair of capacitors, and is disposed adjacent a branching point of the main pair transmission line.

12. The electronic circuit device of claim 11, wherein the pair of capacitors has a total capacitance equal to or larger than 50 times as large a capacitance as the main pair transmission line of a same length as a length of the attenuation circuit along a longitudinal direction of the main pair transmission line.

13. The electronic circuit device of claim 6, 7, 8 or 9, further comprising an attenuation circuit which comprises a pair of electrodes for capacitor formation disposed between the main power-supply line and the main ground line and a resistor connecting the pair of electrodes, and is disposed adjacent a branching point of the main pair transmission line.

14. The electronic circuit device of claim 13, wherein a pair of capacitors each formed between the main pair transmission line and a corresponding electrode has a total capacitance equal to or larger than 50 times as large a capacitance as the main pair transmission line of a same length as a length of the attenuation circuit along a longitudinal direction of the main pair transmission line.

15. The electronic circuit device of claim 6, 7, 8 or 9, further comprising:

a directional coupler comprising paired lines and disposed adjacent a branching point of the main pair transmission line; and a terminating resistance connecting the paired lines.

16. The electronic circuit device of claim 15, wherein a spacing between the main pair transmission line and the directional coupler is equal to or smaller than a thickness of a conductor forming the directional coupler.

* * * * *